US006806651B1

(12) United States Patent
Chistyakov

(10) Patent No.: US 6,806,651 B1
(45) Date of Patent: *Oct. 19, 2004

(54) HIGH-DENSITY PLASMA SOURCE

(75) Inventor: Roman Chistyakov, Andover, MA (US)

(73) Assignee: Zond, Inc., Mansfield, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/249,595

(22) Filed: Apr. 22, 2003

(51) Int. Cl.$^7$ ................................................. H01J 7/24
(52) U.S. Cl. .............................. 315/111.21; 315/111.41; 156/345.44; 118/723 DC
(58) Field of Search ....................... 315/111.21, 111.41, 315/111.61, 111.71, 111.81, 111.91; 204/298.07, 298.08, 298.12, 298.16, 298.2, 298.21, 298.22; 156/345.33, 345.35, 345.38, 345.39, 345.4, 345.41, 345.42, 345.43, 345.44, 345.46; 118/723 ME, 723 DC, 723 I, 723 IR

(56) References Cited

U.S. PATENT DOCUMENTS

| | | | |
|---|---|---|---|
| 3,666,982 A | 5/1972 | Wiegand, Jr. ................ 313/205 |
| 4,716,340 A | * 12/1987 | Lee et al. ............... 204/298.18 |
| 4,953,174 A | 8/1990 | Eldridge et al. .............. 372/87 |
| 4,977,352 A | * 12/1990 | Williamson ............ 315/111.21 |
| 5,015,493 A | 5/1991 | Gruen .......................... 427/38 |
| 5,247,531 A | 9/1993 | Muller-Horsche ............ 372/38 |
| 5,795,452 A | 8/1998 | Kinoshita et al. ...... 204/298.37 |
| 5,821,548 A | 10/1998 | Hinchliffe .............. 250/492.21 |
| 5,846,883 A | 12/1998 | Moslehi ....................... 438/711 |
| 6,093,293 A | 7/2000 | Haag et al. ............. 204/298.12 |
| 6,094,012 A | * 7/2000 | Leung et al. ............ 315/111.81 |
| 6,124,675 A | 9/2000 | Bertrand et al. ........ 315/111.91 |
| 6,137,231 A | * 10/2000 | Anders et al. .......... 315/111.21 |
| 6,284,106 B1 | 9/2001 | Haag et al. ............. 204/192.12 |
| 6,296,742 B1 | 10/2001 | Kouznetsov ........... 204/192.12 |
| 6,395,641 B2 | 5/2002 | Savas .......................... 438/714 |
| 6,413,382 B1 | 7/2002 | Wang et al. ............ 204/192.12 |
| 6,454,920 B1 | 9/2002 | Haag et al. ............. 204/298.12 |
| 6,462,482 B1 | * 10/2002 | Wickramanayaka et al. ...................... 315/111.21 |
| 6,488,822 B1 | 12/2002 | Moslehi ................. 204/192.12 |
| 2001/0047760 A1 | 12/2001 | Moslehi ...................... 118/723 |

FOREIGN PATENT DOCUMENTS

| WO | WO 98/40532 | 9/1998 |
|---|---|---|
| WO | WO 01/98553 A1 | 12/2001 |

OTHER PUBLICATIONS

Booth, et al., The Transition From Symmetric To Asymemtric Discharges In Pulsed 13.56 MHz Capacitively Coupled Plasmas, J. Appl. Phys., Jul. 15, 1997, pp. 552–560, vol. 82, No. 2, American Institute of Physics.

Bunshah, et al., Deposition Technologies For Films And Coatings, pp. 178–183, Noyes Publications, Park Ridge, New Jersey.

(List continued on next page.)

*Primary Examiner*—Don Wong
*Assistant Examiner*—Ephrem Alemu
(74) *Attorney, Agent, or Firm*—Kurt Rauschenbach; Rauschenbach Patent Law Group, LLC

(57) ABSTRACT

The plasma source includes a cathode assembly having an inner cathode section and an outer cathode section. An anode is positioned adjacent to the outer cathode section so as to form a gap there between. A first power supply generates a first electric field across the gap between the anode and the outer cathode section. The first electric field ionizes a volume of feed gas that is located in the gap, thereby generating an initial plasma. A second power supply generates a second electric field proximate to the inner cathode section. The second electric field super-ionizes the initial plasma to generate a plasma comprising a higher density of ions than the initial plasma.

46 Claims, 19 Drawing Sheets

OTHER PUBLICATIONS

Daugherty, et al., Attachment–Dominated Electron–Beam–Ionized Discharges, Applied Physics Letters, May 15, 1976, pp. 581–583, vol. 28, No. 10, American Institue of Physics.

Goto, et al., Dual Excitation Reactive Ion Etcher For Low Energy Plasma Processing, J. Vac. Sci. Technol. A., Sep./Oct. 1992, pp. 3048–3054, vol. 10, No. 5, American Vacuum Society.

Kouznetsov, et al., A Novel Pulsed Magnetron Sputter Technique Utilizing Very High Target Power Densities, Surface and Coatings Technology, 1999, pp. 290–293, vol. 122, Elsevier Science S.A.

Lindquist, et al., High Selectivity Plasma Etching Of Silicone Dioxide With A Dual Frequency 27/2 MHz Capacitive RF Discharge.

Macak, Reactive Sputter Deposition Process Of Al2O3 And Characterization Of A Novel High Plasma Density Pulsed Magnetron Discharge, Linkoping Studies In Science And Technology, pp. 1–2.

Macak, et al., Ionized Sputter Deposition Using An Extremely High Plasma Density Pulsed Magnetron Discharge, J. Vac. Sci. Technol. A., Jul./Aug. 2000, pp. 1533–1537, vol. 18, No. 4., American Vacuum Society.

Mozgrin, et al., High–Current Low–Pressure Quasi–Stationary Discharge In A Magnetic Field: Experimental Research, Plasma Physics Reports, 1995, pp. 400–409, vol. 21, No. 5.

Rossnagel, et al., Induced Drift Currents In Circular Planar Magnetrons, J. Vac. Sci. Technol. A., Jan./Feb. 1987, pp. 88–91, vol. 5, No. 1, American Vacuum Society.

Sheridan, et al., Electron Velocity Distribution Functions In A Sputtering Magnetron Discharge For The E x B Direction, J. Vac. Sci. Technol. A., Jul./Aug. 1998, pp. 2173–2176, vol. 16, No. 4, American Vacuum Society.

Steinbruchel, A Simple Formula For Low–Energy Sputtering Yields, Appl. Phys. A., 1985, pp. 37–42, vol. 36, Sprigner Verlag.

Encyclopedia Of Low Temperature Plasma, p. 119, vol. 3, 2000.

Encyclopedia Of Low Temperature Plasma, p. 123, vol. 3, 2000.

* cited by examiner

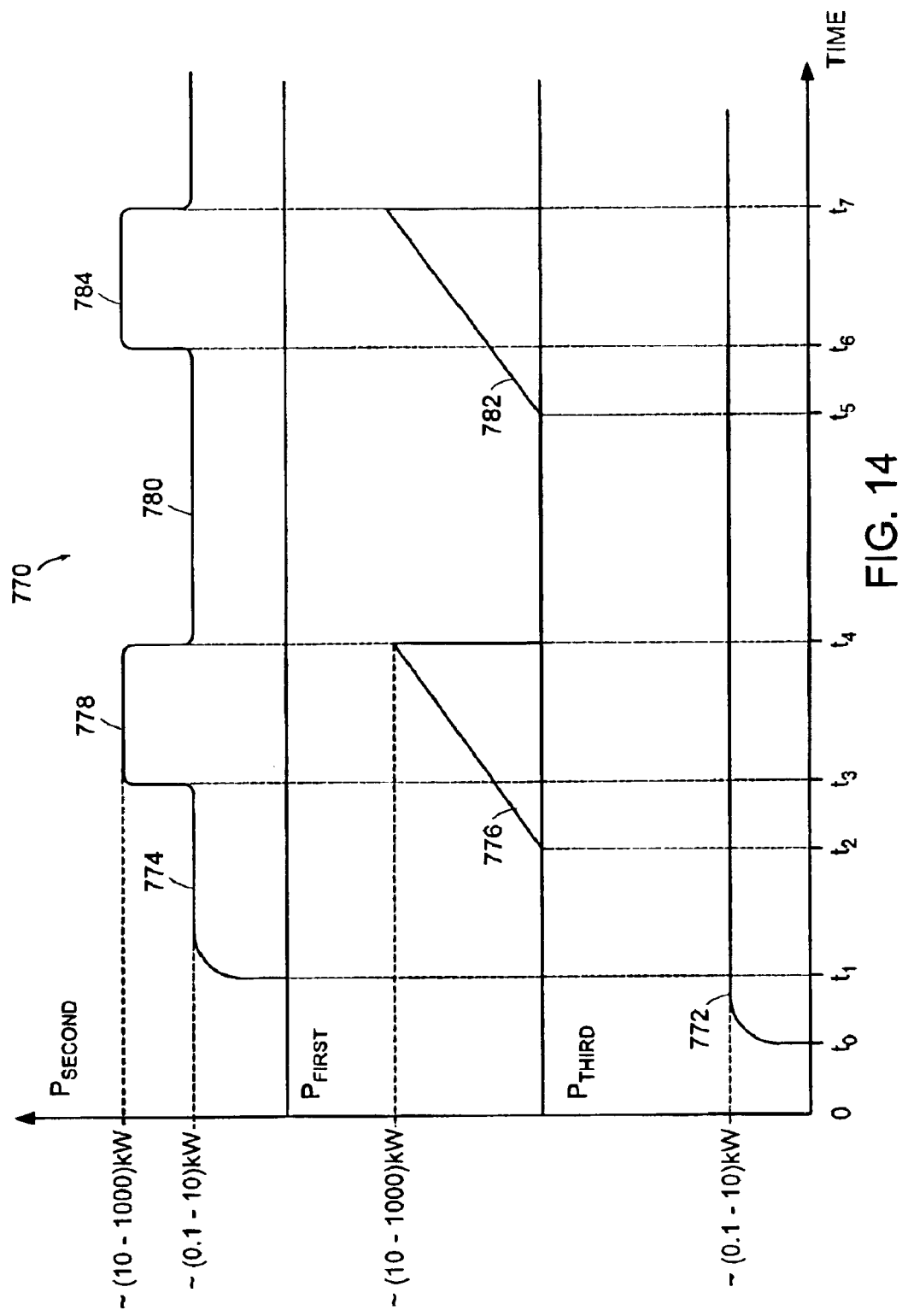

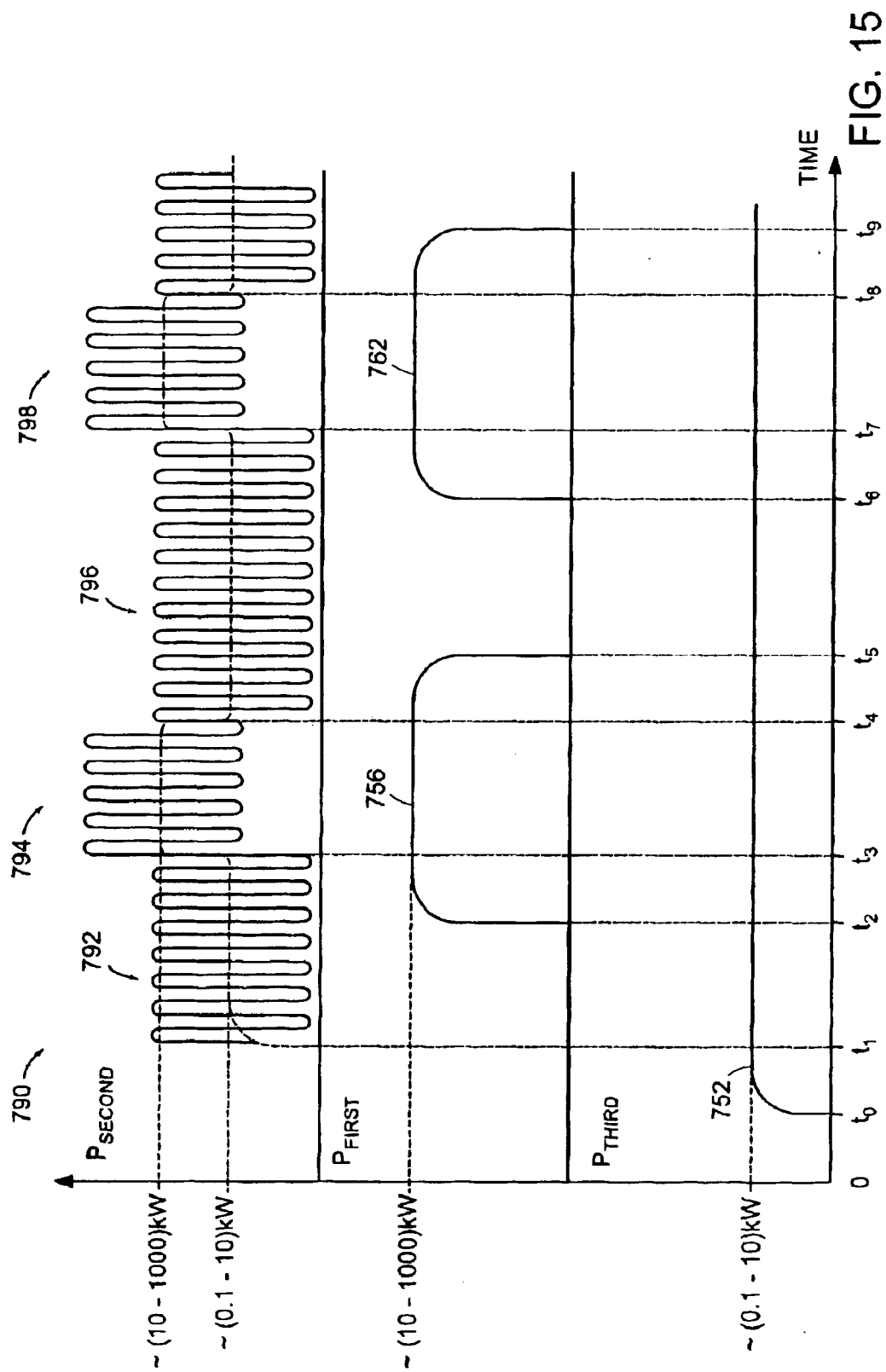

US 6,806,651 B1

HIGH-DENSITY PLASMA SOURCE

BACKGROUND OF INVENTION

Plasma is considered the fourth state of matter. A plasma is a collection of charged particles that move in random directions. A plasma is, on average, electrically neutral. One method of generating a plasma is to drive a current through a low-pressure gas between two conducting electrodes that are positioned parallel to each other. Once certain parameters are met, the gas "breaks down" to form the plasma. For example, a plasma can be generated by applying a potential of several kilovolts between two parallel conducting electrodes in an inert gas atmosphere (e.g., argon) at a pressure that is in the range of about 10 to 10 Torr.

Plasma processes are widely used in many industries, such as the semiconductor manufacturing industry. For example, plasma etching is commonly used to etch substrate material and to etch films deposited on substrates in the electronics industry. There are four basic types of plasma etching processes that are used to remove material from surfaces: sputter etching, pure chemical etching, ion energy driven etching, and ion inhibitor etching.

Plasma sputtering is a technique that is widely used for depositing films on substrates and other work pieces. Sputtering is the physical ejection of atoms from a target surface and is sometimes referred to as physical vapor deposition (PVD). Ions, such as argon ions, are generated and are then drawn out of the plasma and accelerated across a cathode dark space. The target surface has a lower potential than the region in which the plasma is formed. Therefore, the target surface attracts positive ions.

Positive ions move towards the target with a high velocity and then impact the target and cause atoms to physically dislodge or sputter from the target surface. The sputtered atoms then propagate to a substrate or other work piece where they deposit a film of sputtered target material. The plasma is replenished by electron-ion pairs formed by the collision of neutral molecules with secondary electrons generated at the target surface.

Reactive sputtering systems inject a reactive gas or mixture of reactive gases into the sputtering system. The reactive gases react with the target material either at the target surface or in the gas phase, resulting in the deposition of new compounds. The pressure of the reactive gas can be varied to control the stoichiometry of the film. Reactive sputtering is useful for forming some types of molecular thin films.

Magnetron sputtering systems use magnetic fields that are shaped to trap and concentrate secondary electrons proximate to the target surface. The magnetic fields increase the density of electrons and, therefore, increase the plasma density in a region that is proximate to the target surface. The increased plasma density increases the sputter deposition rate.

BRIEF DESCRIPTION OF DRAWINGS

This invention is described with particularity in the detailed description. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 14 illustrates a graphical representation of power generated as a function of time for each of a first, a second and a third power supply for one mode of operating the plasma generating system of FIG. 9.

FIG. 15 illustrates a graphical representation of the power as a function of time for each of a first, a second and a third power supply for one mode of operating the plasma generating system of FIG. 9.

DETAILED DESCRIPTION

Figure 1:
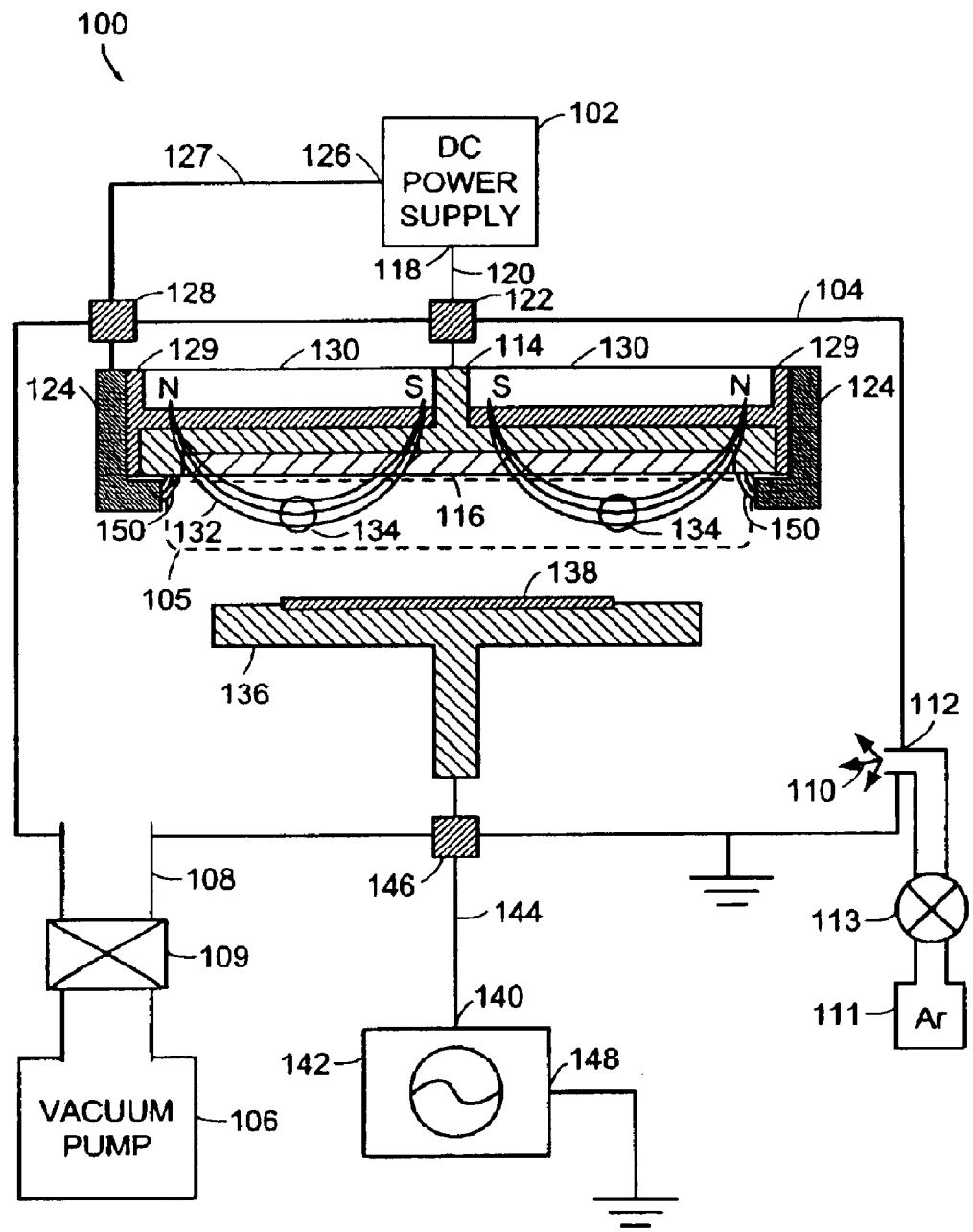
FIG. 1 illustrates a cross-sectional view of a known plasma generating apparatus having a direct current (DC) power supply.

FIG. 1 illustrates a cross-sectional view of a known plasma generating apparatus 100 having a DC power supply 102. The known plasma generating apparatus 100 includes a vacuum chamber 104 where a plasma 105 is generated.

The vacuum chamber 104 can be coupled to ground. The vacuum chamber 104 is positioned in fluid communication with a vacuum pump 106 via a conduit 108 and a valve 109. The vacuum pump 106 is adapted to evacuate the vacuum chamber 104 to high vacuum. The pressure inside the vacuum chamber 104 is generally less than $10^{-1}$ Torr. A feed gas 110 from a feed gas source 111, such as an argon gas source, is introduced into the vacuum chamber 104 through a gas inlet 112. The gas flow is controlled by a valve 113.

The plasma generating apparatus 100 also includes a cathode assembly 114. The cathode assembly 114 is generally in the shape of a circular disk. The cathode assembly 114 can include a target 116. The cathode assembly 114 is electrically connected to a first terminal 118 of the DC power supply 102 with an electrical transmission line 120. An insulator 122 isolates the electrical transmission line 120 from a wall of the vacuum chamber 104. An anode 124 is electrically connected to a second terminal 126 of the DC power supply 102 with an electrical transmission line 127. An insulator 128 isolates the electrical transmission line 127 from the wall of the vacuum chamber 104. The anode 124 is positioned in the vacuum chamber 104 proximate to the cathode assembly 114. An insulator 129 isolates the anode 124 from the cathode assembly 114. The anode 124 and the second output 126 of the DC power supply 102 are coupled to ground in some systems.

The plasma generating apparatus 100 illustrates a magnetron sputtering system that includes a magnet 130 that generates a magnetic field 132 proximate to the target 116. The magnetic field 132 is strongest at the poles of the magnet 130 and weakest in the region 134. The magnetic field 132 is shaped to trap and concentrate secondary electrons proximate to the target surface. The magnetic field increases the density of electrons and, therefore, increases the plasma density in a region that is proximate to the target surface.

The plasma generating apparatus 100 also includes a substrate support 136 that holds a substrate 138 or other work piece. The substrate support 136 can be electrically connected to a first terminal 140 of a RF power supply 142 with an electrical transmission line 144. An insulator 146 isolates the RF power supply 142 from a wall of the vacuum chamber 104. A second terminal 148 of the RF power supply 142 is coupled to ground.

In operation, the feed gas 110 from the feed gas source 111 is injected into the chamber 104. The DC power supply 102 applies a DC voltage between the cathode assembly 114 and the anode 124 that causes an electric field 150 to develop between the cathode assembly 114 and the anode 124. The amplitude of the DC voltage is chosen so that it is sufficient to cause the resulting electric field to ionize the feed gas 110 in the vacuum chamber 104 and to ignite the plasma 105.

The ionization process in known plasma sputtering apparatus is generally referred to as direct ionization or atomic ionization by electron impact and can be described by the following equation.

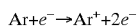

$$Ar + e^- \rightarrow Ar^+ + 2e^-$$

where Ar represents a neutral argon atom in the feed gas 110 and $e^-$ represents an ionizing electron generated in response to the voltage applied between thee cathode assembly 114 and the anode 124. The collision between the neutral argon atom and the ionizing electron results in an argon ion ($Ar^+$) and two electrons.

The plasma 105 is maintained, at least in part, by secondary electron emission from the cathode assembly 114.

The magnetic field 132 that is generated proximate to the cathode assembly 114 confines the secondary electrons in the region 134 and, therefore, confines the plasma 105 approximately in the region 134. The confinement of the plasma in the region 134 increases the plasma density in the region 134 for a given input power.

The plasma generating apparatus 100 can be configured for magnetron sputtering. Since the cathode assembly 114 is negatively biased, ions in the plasma 105 bombard the target 116. The impact caused by these ions bombarding the target 116 dislodges or sputters material from the target 116. A portion of the sputtered material forms a thin film of sputtered target material on the substrate 138.

Known magnetron sputtering systems have relatively poor target utilization. The term "poor target utilization" is defined herein to mean undesirable non-uniform erosion of target material. Poor target utilization is caused by a relatively high concentration of positively charged ions in the region 134 that results in a non-uniform plasma. Similarly, magnetron etching systems (not shown) typically have relatively non-uniform etching characteristics.

Increasing the power applied to the plasma can increase the uniformity and density of the plasma. However, increasing the amount of power necessary to achieve even an incremental increase in uniformity and plasma density can significantly increase the probability of establishing an electrical breakdown condition leading to an undesirable electrical discharge (an electrical arc) in the chamber 104.

Applying pulsed direct current (DC) to the plasma can be advantageous since the average discharge power can remain relatively low while relatively large power pulses are periodically applied. Additionally, the duration of these large voltage pulses can be preset so as to reduce the probability of establishing an electrical breakdown condition leading to an undesirable electrical discharge. An undesirable electrical discharge will corrupt the plasma process and can cause contamination in the vacuum chamber 104. However, very large power pulses can still result in undesirable electrical discharges regardless of their duration.

In one embodiment, an apparatus according to the present invention generates a plasma having a higher density of ions for a giving input power than a plasma generated by known plasma systems, such as the plasma generating apparatus 100 of FIG. 1.

A high-density plasma generation method and apparatus according to the present invention uses an electrode structure including three or more electrodes to generate a high-density plasma including excited atoms, ions, neutral atoms and electrons. The electrodes can be a combination of cathodes, anodes, and/or ionizing electrodes. The electrodes can be configured in many different ways, such as a ring electrode structure, a linear electrode structure, or hollow cathode electrode structure. The plasma generation method and apparatus of the present invention provides independent control of two or more co-existing plasmas in the system.

A high-density plasma source according to the present invention can include one or more feed gas injection systems that inject feed gas proximate to one or more of the electrodes in the plasma source. The feed gas can be any mixture of gases as described herein. The one or more feed gas injection systems can also inject plasma proximate to one or more of the electrodes in the plasma source. The injected plasma can be a high-density plasma or a low-density plasma. In one embodiment, an initial plasma is generated and then it is super-ionized to form a high-density plasma. The term "super-ionized" is defined herein to mean that at least 75% of the neutral atoms in the plasma are converted to ions.

The high-density plasma source of the present invention can operate in a constant power, constant voltage, or constant current mode. These modes of operation are discussed herein. In addition, the high-density plasma source can use different types of power supplies to generate the high-density plasma. For example, direct-current (DC), alternating-current (AC), radio-frequency (RF), or pulsed DC power supplies can be used to generate the high-density plasma. The power supplies can generate power levels in the range of about 1 W to 10MW.

The plasma generated by the high-density plasma source of the present invention can be used to sputter materials from solid or liquid targets. Numerous types of materials can be sputtered. For example, magnetic, non-magnetic, dielectric, metals, and semiconductor materials can be sputtered.

In one embodiment, the high-density plasma source of the present invention generates relatively high deposition rates near the outer edge of a sputtering target. The target can be designed and operated such that the increase in the deposition rate near the outer edge of the sputtering target compensates for the decrease of the sputtering rate typically associated with the edge of a sputtering target. This embodiment allows the use of relatively small targets, which can reduce the overall footprint of a process tool, the cost of the target and the cost to operate the process tool.

The high-density plasma source of the present invention provides high target utilization and high sputtering uniformity. Additionally, the plasma generated by the high-density plasma source of the present invention can be used for producing ions or atoms from molecules for numerous applications, such as sputter etch, reactive etch, chemical vapor deposition, and for generating ion beams.

Figure 2A:
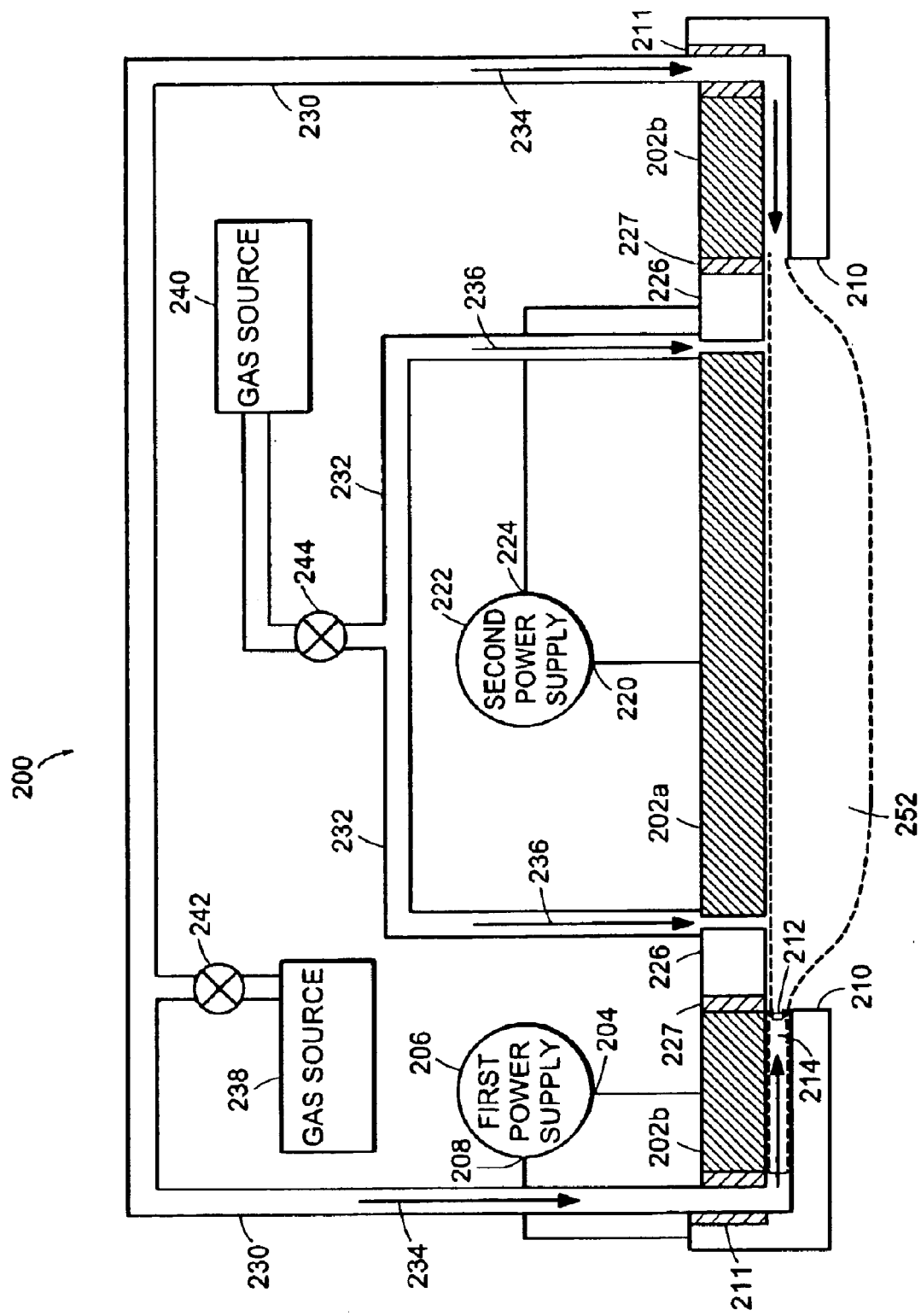
FIG. 2A illustrates a cross-sectional view of a plasma generating apparatus having a segmented cathode according to the invention.

FIG. 2A illustrates a cross-sectional view of a plasma generating apparatus 200 having a segmented cathode 202 according to the invention. In one embodiment, the segmented cathode 202 includes an inner cathode section 202a and an outer cathode section 202b. In some embodiments (not shown), the segmented cathode 202 includes more than two sections. The segmented cathode 202 can be composed of a metal material, such as stainless steel or any other material that does not chemically react with reactive gases. The segmented cathode 202 can include a target (not shown) that is used for sputtering. The inner cathode section 202a and the outer cathode section 202b can be composed of different materials.

The outer cathode section 202b is coupled to a first output 204 of a first power supply 206. The first power supply 206 can operate in a constant power mode. The term "constant power mode" is defined herein to mean that the power generated by the power supply has a substantially constant power level regardless of changes in the output current and the output voltage level. In another embodiment, the first power supply 206 operates in a constant voltage mode. The term "constant voltage mode" is defined herein to mean that the voltage generated by the power supply has a substantially constant voltage level regardless of changes in the output current and the output power level. The first power supply 206 can include an integrated matching unit (not shown). Alternatively, a matching unit (not shown) can be electrically connected to the first output 204 of the first power supply 206.

A second output 208 of the first power supply 206 is coupled to a first anode 210. An insulator 211 isolates the first anode 210 from the outer cathode section 202b. In one embodiment, the second output 208 of the first power supply 206 and the first anode 210 are coupled to ground potential (not shown).

In one embodiment (not shown), the first output 204 of the first power supply 206 couples a negative voltage impulse to the outer cathode section 202b. In another embodiment (not shown), the second output 208 of the first power supply 206 couples a positive voltage impulse to the first anode 210. Numerous types of power supplies can be used for the first power supply 206. For example, the first power supply 206 can be a pulsed power supply, radio-frequency (RF) power supply, an alternating-current (AC) power supply, or a direct-current (DC) power supply.

The first power supply 206 can be a pulsed power supply that generates peak voltage levels of up to about 5 kV. Typical operating voltages are in the range of about 50V to 5 kV. The first power supply 206 can generate peak current levels in the range of about 1 mA to 100 kA depending on the desired volume and characteristics of the plasma. Typical operating currents vary from less than one hundred amperes to more than a few thousand amperes depending on the desired volume and characteristics of the plasma. The first power supply 206 can generate pulses having a repetition rate that is below 1 kHz. The first power supply 206 can generate pulses having a pulse width that is in the range of about one microsecond to several seconds.

The first anode 210 is positioned so as to form a gap 212 between the first anode 210 and the outer cathode section 202b that is sufficient to allow current to flow through a region 214 between the first anode 210 and the outer cathode section 202b. In one embodiment, the width of the gap 212 is in the range of about 0.3 cm to 10 cm. The surface area of the outer cathode section 202b determines the volume of the region 214. The gap 212 and the total volume of the region 214 are parameters in the ionization process as described herein.

For example, the gap 212 can be configured to generate exited atoms from ground state atoms. The excited atoms can increase the density of a plasma. Since excited atoms generally require less energy to ionize than ground state gas atoms, a volume of excited atoms can generate a higher density plasma than a similar volume of ground state feed gas atoms for the same input energy. Additionally, the gap 212 can be configured to conduct exited atoms towards the inner cathode section 202a. The excited atoms can either be generated externally or inside the gap 212 depending on the configuration of the system. In one embodiment, the gap 212 exhibits a pressure differential that forces the exited atoms towards the inner cathode section 202a. This can increase the density of the plasma proximate to the inner cathode section 202a as previously discussed.

The gap 212 can be a plasma generator. In this configuration, feed gas is supplied to the gap 212 and a plasma is ignited in the gap 212. An ignition condition in the gap 212 can be optimized by varying certain parameters of the gap 212. For example, the presence of crossed electric and magnetic fields in the gap 212 can assist in the ignition and development of a plasma in the gap 212. The crossed electric and magnetic fields trap electrons and ions, thereby improving the efficiency of the ionization process.

The gap 212 can facilitate the use of high input power. For example, as high power is applied to a plasma that is ignited and developing in the gap 212, additional feed gas can be supplied to the gap 212. This additional feed gas displaces some of the already developing plasma and absorbs any excess power applied to the plasma. The absorption of the excess power prevents the plasma from contracting and terminating which could otherwise occur without the additional feed gas.

In some embodiments (not shown), the first anode 210 and/or the outer cathode section 202b can include raised areas, depressed areas, surface anomalies, or shapes that improve the ionization process. For example, the pressure in the region 214 can be optimized by including a raised area (not shown) on the surface of the outer cathode section 202*b*. The raised area can create a narrow passage at a location in the region 214 between the first anode 210 and the outer cathode section 202*b* that changes the pressure in the region 214.

The first output 220 of a second power supply 222 is electrically coupled to the inner cathode section 202*a*. The second power supply 222 can operate in a constant power mode or a constant voltage mode. The second power supply 222 can have an integrated matching unit (not shown). Alternatively, a matching unit (not shown) is electrically connected to the first output 220 of the first power supply 222. The second power supply 222 can be any type of power supply, such as a pulsed power supply, a DC power supply, an AC power supply, or a RF power supply.

A second output 224 of the second power supply 222 is coupled to a second anode 226. An insulator 227 is positioned to isolate the second anode 226 from the outer cathode section 202*b*. Another insulator (not shown) can be positioned to isolate the second anode 226 from the inner cathode section 202*a*. In one embodiment (not shown), the second output 224 of the second power supply 222 and the second anode 226 are electrically connected to ground potential.

The first output 220 of the second power supply 222 can couple a negative voltage impulse to the inner cathode section 202*a*. The second output 224 of the second power supply 222 can couple a positive voltage impulse to the second anode 226.

The second power supply 222 can be a pulsed power supply that generates peak voltage levels in the range of about 50V to 5 kV. The second power supply 222 can generate peak current levels in the range of about 1 mA to 100 kA depending on the desired volume and characteristics of the plasma. Typical operating currents varying from less than one hundred amperes to more than a few thousand amperes depending on the desired volume and characteristics of the plasma and the desired plasma density. The pulses generated by the second power supply 222 can have a repetition rate that is below 1 kHz. The pulse width of the pulses generated by the second power supply 222 can be between about one microsecond and several seconds.

The second anode 226 is positioned proximate to the inner cathode section 202*a* such that current is capable of flowing between the second anode 226 and the inner cathode section 202*a*. The distance between the second anode 226 and the inner cathode section 202*a* can be in the range of about 0.3 cm to 10 cm.

The plasma generating apparatus 200 can include a chamber (not shown), such as a vacuum chamber. The chamber is coupled in fluid communication to a vacuum pump (not shown) through a vacuum valve (not shown). The chamber can be electrically coupled to ground potential.

One or more gas lines 230, 232 provide feed gas 234, 236 (indicated by arrows) from one or more feed gas sources 238, 240, respectively, to the chamber. The feed gas lines 230, 232 can include in-line gas valves 242, 244 that can control the gas flow to the chamber. The gas lines 230, 232 can be isolated from the chamber and other components by insulators (not shown). The gas lines 230, 232 can be isolated from the one or more feed gas sources 238, 240 using in-line insulating couplers (not shown). The one or more feed gas sources 238, 240 can include any feed gas, such as argon. The feed gas can be a mixture of different gases, reactive gases, or pure reactive gas gases. The feed gas can include a noble gas or a mixture of gases.

In one embodiment, the in-line gas valves 242, 244 are switchable mass flow controllers (not shown). The switchable mass flow controllers can be programmed inject the feed gases 234, 236 in a pulsed manner from the feed gas sources 238, 240, respectively. For example, the pressure in the gap 212 can be varied and optimized by pulsing the feed gas 234 that is injected directly into the gap 212. In one embodiment, the timing of the pulses is synchronized to the timing of power pulses generated by the first power supply 206 operated in a pulsed mode. Pulsing the feed gases 234, 236 can also assist in the generation of excited atoms including metastable atoms in the gap 212. For example, by pulsing the feed gas 234 in the gap 212, the instantaneous pressure in the gap is increased while the average pressure in the chamber is unchanged.

Skilled artisans will appreciate that the plasma generating apparatus 200 can be operated in many different modes. In some modes of operation, the first 206 and the second power supplies 222 together with the segmented cathode 202 are used to generate independent plasmas. The parameters of an initial plasma and a high-density plasma can be varied individually as required by the particular plasma process.

In one mode of operation, the feed gas 234 from the feed gas source 238 is supplied to the chamber by controlling the gas valve 242. The feed gas 234 is supplied between the outer cathode section 202*b* and the first anode 210. The feed gas 234 can be directly injected into the gap 212 between the outer cathode section 202*b* and the first anode 210 in order to increase the density of a plasma that is generated in the gap 212. Increasing the flow rate of the feed gas causes a rapid volume exchange in the region 214 between the outer cathode section 202*b* and the first anode 210. This rapid volume exchange increases the maximum power that can be applied across the gap 212 and thus, permits a high-power pulse having a relatively long duration to be applied across the gap 212. Applying high-power pulses having relatively long durations across the gap 212 results in the formation of high-density plasmas in the region 214, as described herein.

In another mode of operation, the first power supply 206 is a component in an ionization source that generates an initial or a pre-ionization plasma in the region 214. The pre-ionization plasma can be a weakly-ionized plasma. The term "weakly-ionized plasma" is defined herein to mean a plasma with a relatively low peak plasma density. The peak plasma density of the weakly ionized plasma depends on the properties of the specific plasma processing system. For example, a weakly ionized argon plasma is a plasma that has a peak plasma density that is in the range of about $10^7$ to $10^{12}$ cm$^{-3}$.

After a sufficient volume of the feed gas 234 is supplied between the outer cathode section 202*b* and the first anode 210, the first power supply 206 applies a voltage between the outer cathode section 202*b* and the first anode 210. The first power supply 206 can be a pulsed (DC) power supply that applies a negative voltage pulse to the outer cathode section 202*b*. The size and shape of the voltage pulse are chosen such that an electric field 250 (FIG. 2B) develops between the outer cathode section 202*b* and the first anode 210. The first power supply can be a DC, AC, or a RF power supply.

The amplitude and shape of the electric field 250 are chosen such that an initial plasma is generated in the region 214 between the first anode 210 and the outer cathode section 202*b*. The initial plasma can be a weakly-ionized plasma that is used for pre-ionization and generally has a relatively low-level of ionization, as described herein. In one embodiment, the first power supply 206 generates a low power pulse having an initial voltage that is in the range of about 100V to 5 kV with a discharge current that is in the range of about 0.1 A to 100A. The width of the pulse can be in the range of approximately 0.1 microseconds to one hundred seconds. Specific parameters of the pulse are discussed herein in more detail.

In another mode of operation, prior to the generation of the initial plasma in the region 214, the first power supply 206 generates a potential difference between the outer cathode section 202b and the first anode 210 before the feed gas 234 is supplied to the region 214. In this mode of operation, the feed gas 234 is ignited once a sufficient volume of feed gas is present in the region 214.

In yet another mode of operation, a direct current (DC) power supply (not shown) is used in an ionization source to generate and maintain the initial plasma in the region 214. In this mode of operation, the DC power supply is adapted to generate a voltage that is large enough to ignite the initial plasma. For example, the DC power supply can generate an initial voltage of several kilovolts that creates a plasma discharge voltage that is in the range of about 100V to 1 kV with a discharge current that is in the range of about 0.1 A to 100A. The value of the discharge current depends on the power level of the DC power supply and is a function of the volume and characteristics of the plasma. Furthermore, the presence of a magnetic field (not shown) in the region 214 can have a dramatic effect on the value of the applied voltage and current that is required to generate the initial plasma.

The DC power supply can generate a current that is in the range of about 1 mA to 100A depending on the volume of the plasma and the strength of a magnetic field in a region 214. In one embodiment, before generating the initial plasma, the DC power supply is adapted to generate and maintain an initial peak voltage potential between the outer cathode section 202b and the first anode 210 before the introduction of the feed gas 234.

In still another mode of operation, an alternating current (AC) power supply (not shown) is used to generate and maintain the initial plasma in the region 214. An AC power supply can require less power to generate and maintain a plasma than a DC power supply. In other modes of operation, the initial plasma can be generated and maintained using a planar discharge source, a radio frequency (RF) diode source, an ultraviolet (UV) source, an X-ray source, an electron beam source, an ion beam source, an inductively coupled plasma (ICP) source, a capacitively coupled plasma (CCP) source, a microwave plasma source, an electron cyclotron resonance (ECR) source, a helicon plasma source, or ionizing filament techniques. In some of these modes of operation, an initial plasma can be formed outside of the region 214 and then diffused into the region 214.

Forming an initial plasma in the region 214 substantially eliminates the probability of establishing a breakdown condition in the chamber when high-power pulses are subsequently applied between the outer cathode section 202b and the first anode 210. The probability of establishing a breakdown condition is substantially eliminated because the initial plasma has at least a low-level of ionization that provides electrical conductivity through the plasma. This conductivity substantially prevents the setup of a breakdown condition, even when high-power is applied to the plasma.

Referring back to FIG. 2A, the initial plasma diffuses somewhat homogeneously through the region 252 as additional feed gas 234 is injected into the region 214. The additional feed gas 234 forces the initial plasma from the region 214 into the region 252. This homogeneous diffusion tends to facilitate the creation of a highly uniform plasma in the region 252. In one embodiment, the pressure in the region 214 is higher than the pressure in the region 252. This pressure gradient causes the initial plasma in the region 214 to diffuse into the region 252.

Once an initial plasma is formed, several modes of operation can be realized. For example, in one mode of operation, the first power supply 206 generates high-power pulses in the gap 212 between the outer cathode section 202b and the first anode 210. The desired power level of the high-power pulses depends on several factors including the desired volume and characteristics of the plasma as well as the density of the initial plasma. In one embodiment, the power level of the high-power pulse is in the range of about 1 kW to 10 MW.

Each of the high-power pulses is maintained for a predetermined time that can be in the range of about one microsecond to ten seconds. The repetition frequency or repetition rate of the high-power pulses can be in the range of about 0.1 Hz to 1 kHz. The average power generated by the first power supply 206 can be less than one megawatt depending on the characteristics and the volume of the plasma. The thermal energy in the outer cathode section 202b and/or the first anode 210 can be conducted away or dissipated by liquid or gas cooling such as helium cooling (not shown).

The high-power pulses generate an electric field 250 (FIG. 26) between the outer cathode section 202b and the first anode 210. The electric field 250 can be a relatively strong electric field, depending on the strength and duration of the high-power pulses. The electric field 250 is substantially located in the region 214 between the outer cathode section 202b and the first anode 210. The electric field 250 can be a static or a pulsed electric field. In another embodiment, the electric field 250 is a quasi-static electric field. The term "quasi-static electric field" is defined herein to mean an electric field that has a characteristic time of electric field variation that is much greater than the collision time for electrons with neutral gas particles. Such a time of electric field variation can be on the order of ten seconds. In another embodiment, the electric field can be an alternating electric field. The term "alternating electric field" is defined herein to mean that the polarity of the electric field changes with time. The strength and the position of the electric field 250 are discussed in more detail herein.

The high-power pulses generate a high-density plasma from the initial plasma. The term "high-density plasma" is also referred to as a "strongly-ionized plasma." The terms "high-density plasma" and "strongly-ionized plasma" are defined herein to mean a plasma with a relatively high peak plasma density. For example, the peak plasma density of the high-density plasma is greater than about $10^{12}$ cm$^{-3}$. The discharge current that is formed from the high-density plasma can be on the order of about 5 kA with a discharge voltage that is in the range of about 50V to 500V for a pressure that is in the range of about 5 mTorr to 10 Torr.

The high-density plasma tends to diffuse homogenously in the region 252. The homogenous diffusion creates a more homogeneous plasma volume. The pressure gradient responsible for this homogenous diffusion is described in more detail herein. Homogeneous plasma volumes are advantageous for many plasma processes. For example, plasma etching processes using homogenous plasma volumes accelerate ions in the high-density plasma towards the surface of the substrate (not shown) being etched in a more uniform manner than conventional plasma etching. Consequently, the surface of the substrate is etched more uniformly. Plasma processes using homogeneous plasma volumes can achieve high uniformity without the necessity of rotating the substrate.

Magnetron sputtering systems using homogenous plasma volumes accelerate ions in the high-density plasma towards the surface of the sputtering target in a more uniform manner than conventional magnetron sputtering. Consequently, the target material is deposited more uniformly on a substrate without the necessity of rotating the substrate and/or the magnetron. Also, the surface of the sputtering target is eroded more evenly and, thus higher target utilization is achieved. In one embodiment, target material can be applied to the first 210 and/or the second anode 226 to reduce possible contamination from sputtering undesired material.

Referring back to FIG. 2A, the second power supply 222 can be a pulsed power supply that generates high-power pulses between the inner cathode section 202a and the second anode 226 after the high-density plasma is formed in the region 214 and diffuses into the region 252 proximate to the inner cathode section 202a. The desired power level of the high-power pulses depends on several factors including the volume and other characteristics of the plasma such as the density of the high-density plasma. In one embodiment, the power level of the high-power pulse is in the range of about 1 kW to 10MW.

Each of the high-power pulses is maintained for a predetermined time that can be in the range of one microsecond to ten seconds. The repetition frequency or repetition rate of the high-power pulses can be in the range of between about 0.1 Hz and 1 kHz. The average power generated by the second power supply 222 can be less than one megawatt depending on the desired volume and characteristics of the plasma. The thermal energy in the inner cathode section 202a and/or the second anode 226 can be conducted away or dissipated by liquid or gas cooling such as helium cooling (not shown).

The high-power pulses generate an electric field 254 (FIG. 2B) between the inner cathode section 202a and the second anode 226. The electric field 254 can be a pulsed electric field, a quasi-static electric field or an alternating electric field. The strength and the position of the electric field 254 will be discussed in more detail herein.

The second power supply 222 generates high power pulses that launch additional power into the already strongly ionized plasma and, therefore, super-ionize the high-density plasma in the region 252. The discharge current can be on the order of 5 kA with a discharge voltage that is in the range of about 50V to 500V for a pressure that is in the range of about 5 mTorr to 10 Torr.

In another mode of operation, an initial plasma is generated in the region 214 and the initial plasma diffuses to the region 252 as additional feed gas is supplied to the region 214.

In this mode of operation, the gap 212 is dimensioned to create a pressure differential between the region 214 and the region 252. The pressure differential forces the initial plasma that is generated in the region 214 into the region 252. In this embodiment, the second power supply 222 applies high-power pulses between the inner cathode section 202a and the second anode 226 after a suitable volume of initial plasma is present in the region 252. The high-power pulses create an electric field 254 between the inner cathode section 202b and the second anode 226 that strongly-ionizes the initial plasma thereby creating a high-density plasma in the region 252.

In yet another mode of operation, feed gas 236 from the feed gas source 240 flows between the second anode 226 and the inner cathode section 202a at various times during the plasma generation process. This additional feed gas 236 can be a noble gas, a reactive gas, or a mixture of gases. The additional feed gas 236 can facilitate a more efficient plasma generation process and/or can result in a higher density plasma.

In still another mode of operation, a voltage generated by the second power supply 222 is sufficient to ignite a second plasma (not shown) from the feed gas 236 in the region 255 between the second anode 226 and the inner cathode section 202a. This second plasma flows from the region 255 into the region 252 as the second plasma is displaced by more feed gas 236. Additionally, the second plasma from the region 255 can commingle with the initial plasma from the region 214 in the region 252. In one embodiment, a plasma diverting plate 256 (FIG. 2B) is disposed proximate to the second anode 226 to divert the second plasma from the region 255 toward the inner cathode section 202a and/or towards the region 214. The size, shape, and location of the plasma diverting plate 256 depend on the desired plasma properties of the second plasma. In one embodiment, target material can be applied to the plasma diverting plate 256 to reduce possible contamination from sputtering undesired material.

Controlling the flow of the feed gases 234, 236 through the regions 214, 255, respectively, can affect the homogeneity, distribution profile, and density of the plasma. Additionally, controlling certain parameters, such as power and pulse rate of the first 206 and the second power supplies 222 (FIG. 2A) can also affect the homogeneity, distribution profile, and density of the plasma.

The plasma generating apparatus 200 of the present invention generates a relatively high electron temperature plasma and a relatively high-density plasma. One application for the high-density plasma of the present invention is ionized physical vapor deposition (IPVD) (not shown), which is a technique that converts neutral sputtered atoms into positive ions to enhance a sputtering process.

Figure 2B:
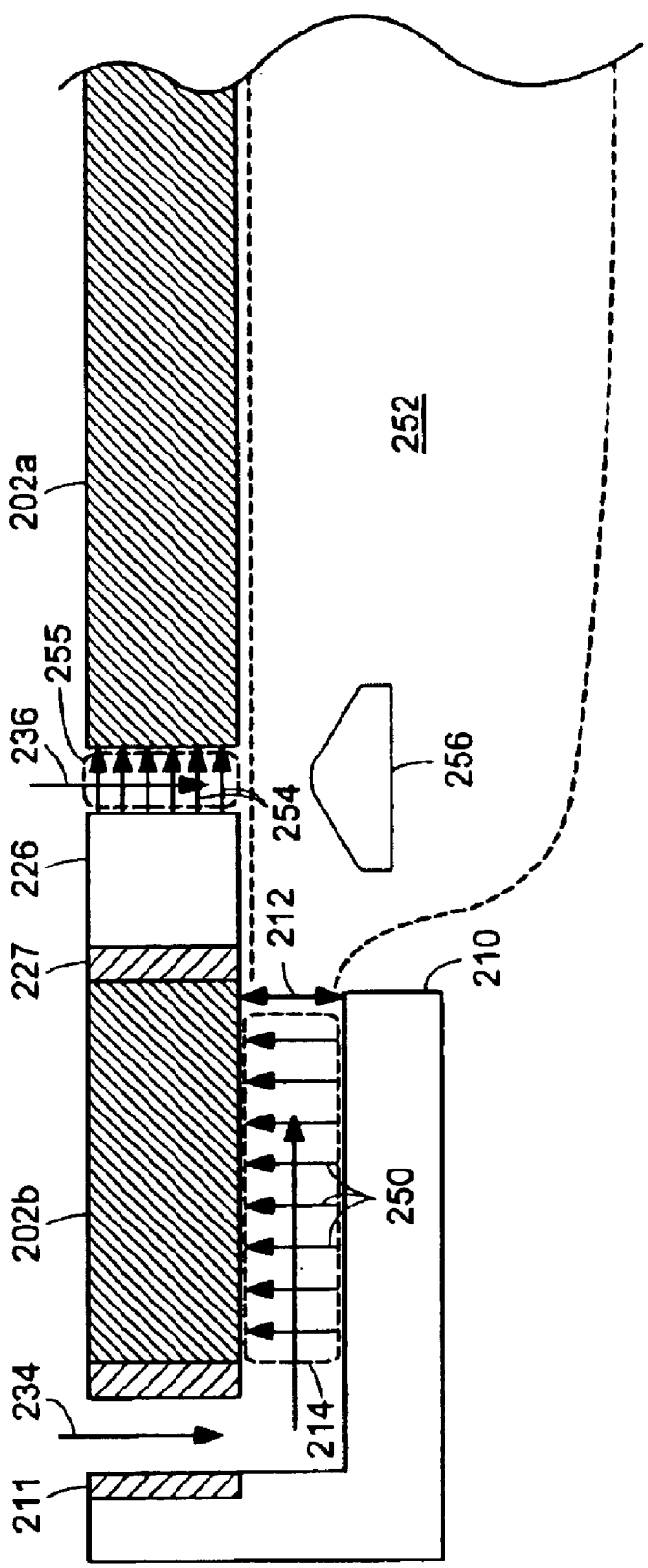
FIG. 2B illustrates a cross-sectional view of the segmented cathode of FIG. 2A.

FIG. 2B illustrates a cross-sectional view of the segmented cathode of FIG. 2A. Specifically, FIG. 2B shows that one or both of the electric fields 250, 254 can facilitate a multi-step ionization process of the feed gases 234, 236, respectively, that substantially increases the rate at which the high-density plasma is formed. At least one of the feed gases 234, 236 can be a molecular gas. The electric fields 250, 254 enhance the formation of ions in the plasma. The multi-step or stepwise ionization process is described as follows with reference to the electric field 250 between the outer cathode section 202b and the first anode 210.

A pre-ionizing voltage is applied between the outer cathode section 202b and the first anode 210 across the feed gas 234 to form an initial plasma. The initial plasma can be a weakly-ionized plasma as previously discussed. The initial plasma is generally formed in the region 214 and diffuses or is transported to the region 252 as the feed gas 234 continues to flow. In one embodiment (not shown), a magnetic field is generated in the region 214 and extends proximate to the center of the inner cathode section 202a. This magnetic field tends to assist in diffusing electrons in the initial plasma from the region 214 to the region 252. The electrons in the initial plasma are substantially trapped in the region 252 by the magnetic field. The volume of initial plasma in the region 214 can be rapidly exchanged with a new volume of feed gas 234.

After the formation of the initial plasma in the region 214, the first power supply 206 (FIG. 2A) applies a high-power pulse between the outer cathode section 202b and the first anode 210. This high-power pulse generates the electric field 250 in the region 214. The electric field 250 results in collisions occurring between neutral atoms, electrons, and ions in the initial plasma. These collisions generate numerous excited atoms in the initial plasma. The excited atoms can include atoms that are in a metastable state.

The accumulation of excited atoms in the initial plasma alters the ionization process. The electric field 250 can be a strong electric field that facilitates a multi-step ionization process of an atomic feed gas that significantly increases the rate at which the high-density plasma is formed. The multi-step ionization process has an efficiency that increases as the density of excited atoms in the initial plasma increases. The strong electric field 250 enhances the formation of ions of a molecular or atomic feed gas.

In one embodiment, the dimensions of the gap 212 between the outer cathode section 202b and the first anode 210 are chosen so as to maximize the rate of excitation of the atoms. The value of the electric field 250 in the region 214 depends on the voltage level applied by the first power supply 206 and the dimensions of the gap 212. In some embodiments, the strength of the electric field 250 can be in the range of about 2V/cm to $10^5$ V/cm depending on various system parameters and operating conditions of the plasma system.

The size of the gap 212 can be in the range of about 0.30 cm to 10 cm depending on various parameters of the desired plasma. In one embodiment, the electric field 250 in the region 214 is rapidly applied to the initial plasma. The rapidly applied electric field 250 can be generated by applying a voltage pulse having a rise time that is in the range of about 0.1 microsecond to ten seconds.

In one embodiment, the dimensions of the gap 212 and the parameters of the applied electric field 250 are varied in order to determine the optimum condition for a relatively high rate of excitation of the atoms in the region 214. Since an argon atom requires energy of about 11.55 eV to become excited, the applied electric field 250 can be adjusted to maximize the excitation rate of the argon atoms. As argon feed gas 234 flows through the region 214, the initial plasma is formed and many of the atoms in the initial plasma then become excited by the applied electric field 250. Thus, the vast majority of ground state feed gas atoms are not directly ionized, but instead undergo a stepwise ionization process.

The excited atoms in the initial plasma then encounter electrons that are in the region 214. In the case of argon feed case, excited argon atoms only require about 4 eV of energy to ionize while argon ground state atoms require about 15.76 eV of energy to ionize. Therefore, when energy is applied in the region 214, the excited atoms will ionize at a much higher rate than the ground state atoms. Ions in the high-density plasma strike the outer cathode section 202b causing secondary electron emission from the outer cathode section 202b. These secondary electrons interact with neutral or excited atoms in the high-density plasma. This process further increases the density of ions in the high-density plasma as the feed gas 234 is exchanged.

The multi-step ionization process corresponding to the rapid application of the electric field 250 can be described as follows:

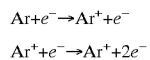

where Ar represents a neutral ground state argon atom in the feed gas 234 and e⁻ represents an ionizing electron generated in response to an initial plasma, when sufficient voltage is applied between the outer cathode section 202b and the first anode 210. Additionally, Ar* represents an excited argon atom in the initial plasma. The collision between the excited argon atom and the ionizing electron results in an argon ion (Ar⁺) and two electrons.

As previously discussed, the excited argon atoms generally require less energy to become ionized than neutral ground state argon atoms. Thus, the excited atoms tend to more rapidly ionize near the surface of the outer cathode section 202b than the neutral ground state argon atoms. As the density of the excited atoms in the plasma increases, the efficiency of the ionization process rapidly increases. This increased efficiency eventually results in an avalanche-like increase in the density of the high-density plasma. Under appropriate excitation conditions, the proportion of the energy applied to the initial plasma, which is transformed to the excited atoms, is very high for a pulsed discharge in the feed gas 234.

In one mode of operation, the density of the plasma is increased by controlling the flow of the feed gas 234 in the region 214. In this embodiment, a first volume of feed gas 234 is supplied to the region 214. The first volume of feed gas 234 is then ionized to form an initial plasma in the region 214. The first power supply 206 then applies a high-power electrical pulse across the initial plasma. The high-power electrical pulse generates a high-density plasma from the initial plasma.

In another mode of operation, the feed gas 234 continues to flow into the region 214 after the initial plasma is formed. The initial plasma is displaced or transported into the region 252 by a new volume of feed gas 234. The second power supply 222 (FIG. 2A) then applies a high-power electrical pulse between the inner cathode section 202a and the second anode 226.

The density of the plasma is generally limited by the level and duration of the high-power electrical pulse that can be absorbed before the discharge contracts and terminates. Increasing the flow rate of at least one of the feed gases 234, 236 can increase the level and duration of the high-power electrical pulse that can be absorbed by the discharge. Any type of gas exchange means can be used to rapidly exchange the volume of feed gas.

Thus, the density of the plasma can be increased by transporting the initial plasma through the region 214 by a rapid volume exchange of feed gas 234. As the feed gas 234 moves through the region 214 and interacts with the moving initial plasma, it becomes partially ionized from the applied electrical pulse. Applying a high-power electrical pulse through the region 214 can result in an ionization process that includes a combination of direct ionization and/or stepwise ionization as described herein. Transporting the initial plasma through the region 214 by a rapid volume exchange of the feed gas 234 increases the level and the duration of the power that can be applied to the high-density plasma and, thus, generates a higher density strongly-ionized plasma.

In one embodiment, the plasma generating system 200 can be configured for plasma etching. In another embodiment, the plasma generating system 200 can be configured for plasma sputtering. In particular, the plasma generating system 200 can be configured for sputtering magnetic materials. Known magnetron sputtering systems generally are not suitable for sputtering magnetic materials because the magnetic field generated by the magnetron can be absorbed by the magnetic target material. RF diode sputtering is sometimes used to sputter magnetic materials. However, RF diode sputtering generally has poor film thickness uniformity and produces relatively low deposition rates.

The plasma generating system 200 can be adapted to sputter magnetic materials by including a target assembly (not shown) having a magnetic target material and by driving that target assembly with an RF power supply (not shown). For example, an RF power supply can provide an RF power that is about 10 kW. A substantially uniform initial plasma can be generated by applying RF power across a feed gas that is located proximate to the target assembly. The high-density plasma is generated by applying a strong electric field across the initial plasma as described herein. The RF power supply applies a negative voltage bias to the target assembly. Ions in the high-density plasma bombard the target material thereby causing sputtering.

The plasma generating system 200 can also be adapted to sputter dielectric materials. Dielectric materials can be sputtered by driving a target assembly (not shown) including a dielectric target material with an RF power supply (not shown). For example, an RF power supply can provide an RF power that is about 10 kW. A substantially uniform initial plasma can be generated by applying RF power across a feed gas that is located proximate to the target assembly.

In one embodiment, a magnetic field is generated proximate to the target assembly in order to trap electrons in the initial plasma. The high-density plasma is generated by applying a strong electric field across the initial plasma as described herein. The RF power supply applies a negative voltage bias to the target assembly. Ions in the high-density plasma bombard the target material thereby causing sputtering.

A high-density plasma according to the present invention can be used to generate an ion beam. An ion beam source according to the present invention includes the plasma generating system 200 and an external electrode (not shown) that is used to accelerate ions in the plasma. In one embodiment, the external electrode is a grid. The ion beam source can generate a very high-density ion flux. For example, the ion beam source can generate ozone flux. Ozone is a highly reactive oxidizing agent that can be used for many applications such as cleaning process chambers, deodorizing air, purifying water, and treating industrial wastes, for example.

Figure 3:
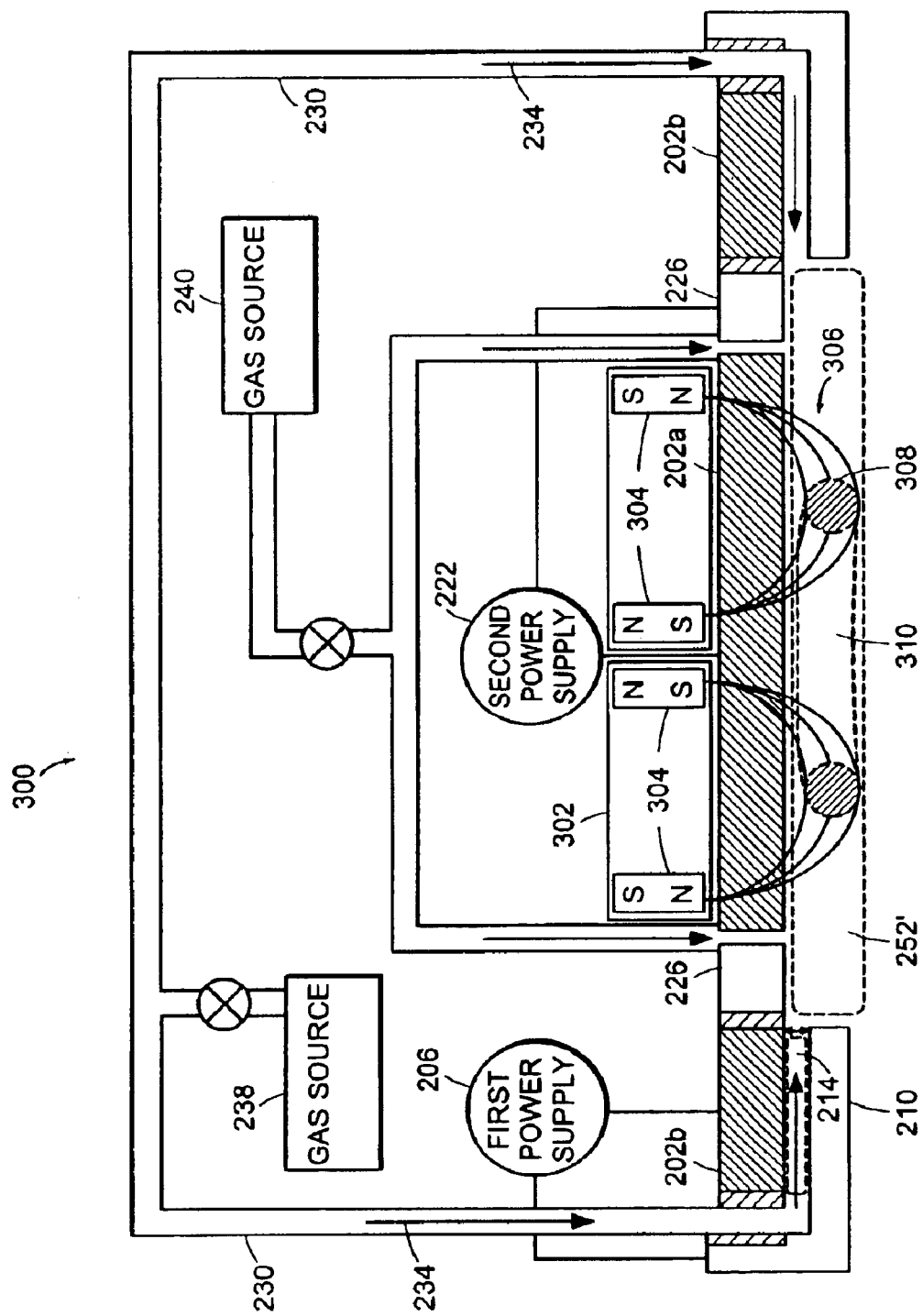
FIG. 3 illustrates a cross-sectional view of a plasma generating apparatus including a magnet assembly according to the invention.

FIG. 3 illustrates a cross-sectional view of a plasma generating apparatus 300 including a magnet assembly 302 according to the invention. The magnet assembly 302 can include permanent magnets 304, or alternatively, electro-magnets (not shown). In one embodiment, the magnet assembly 302 is adapted to create a magnetic field 306 proximate to the inner cathode section 202a. The configuration of the magnet assembly 302 can be varied depending on the desired shape and strength of the magnetic field 306. The magnet assembly 302 can have either a balanced or unbalanced configuration.

In one embodiment, the magnet assembly 302 includes switching electro-magnets, which generate a pulsed magnetic field proximate to the inner cathode section 202a. In some embodiments, additional magnet assemblies (not shown) can be placed at various locations around and throughout the process chamber (not shown).

The magnetic assembly 302 can be configured to generate a magnetic field in the shape of one or more racetracks (not shown). Magnetic fields in the shape of one or more racetracks can improve target utilization in sputtering targets by distributing regions of highest target erosion across the surface of the target. These regions of high target erosion generally correspond to locations in which the magnetic field lines are parallel to the surface of the target.

In operation, the magnetic field 306 is generated proximate to the inner cathode section 202a. The permanent magnets 304 continuously generate the magnetic field 306. Electro-magnets can also generate the magnetic field 306. The strength of the magnetic field 306 can be in the range of about fifty gauss to two thousand gauss. After the magnetic field 306 is generated, the feed gas 234 from the gas source 238 is supplied between the outer cathode section 202b and the first anode 210. A volume of the feed gas 234 fills in the region 214.

Next, the first power supply 206 generates an electric field across the feed gas 234 to ignite an initial plasma in the region 214. The feed gas 234 flows through the region 214 and continuously displaces the initial plasma. The initial plasma diffuses into the region 252' and the magnetic field 306 traps electrons in the initial plasma. A large fraction of the electrons are concentrated in the region 308 that corresponds to the weakest area of the magnetic field 306 that is generated by the magnet assembly 302. By trapping the electrons in the region 308, the magnetic field 306 substantially prevents the initial plasma from diffusing away from the inner cathode section 202a.

The second power supply 222 generates a strong electric field between the second anode 226 and the inner cathode section 202a. The strong electric field super-ionizes the initial plasma to generate a high-density plasma having an ion density that is greater than the ion density of the initial plasma. In one embodiment, the initial plasma has an ion density that is in the range of about $10^7$ to $10^{12}$ cm$^{-3}$ and the high-density plasma has an ion density that is greater than about $10^{12}$ cm$^{-3}$.

The magnetic field 306 can improve the homogeneity of the high-density plasma. The magnetic field 306 can also increase the ion density of the high-density plasma by trapping electrons in the initial plasma and also by trapping secondary electrons proximate to the inner cathode section 202a. The trapped electrons ionize excited atoms in the initial plasma thereby generating the high-density plasma. In one embodiment (not shown), a magnetic field is generated in the region 214 that substantially traps electrons in the area where the initial plasma is ignited.

The magnetic field 306 also promotes increased homogeneity of the high-density plasma by setting up a substantially circular electron ExB drift current 310 proximate to the inner cathode section 202a. In one embodiment, the electron ExB drift current 310 generates a magnetic field that interacts with the magnetic field 306 generated by the magnet assembly 302.

When high-power pulses are applied between the inner cathode section 202a and the second anode 226 secondary electrons are generated from the inner cathode section 202a that move in a substantially circular motion proximate to the inner cathode section 202a according to crossed electric and magnetic fields. The substantially circular motion of the electrons generates the electron ExB drift current 310. The magnitude of the electron ExB drift current 310 is proportional to the magnitude of the discharge current in the plasma and, in one embodiment, is approximately in the range of about three to ten times the magnitude of the discharge current.

In one embodiment, the substantially circular electron ExB drift current 310 generates a magnetic field that interacts with the magnetic field 306 generated by the magnet assembly 302. In one embodiment, the magnetic field generated by the electron ExB drift current 310 has a direction that is substantially opposite to the magnetic field 306 generated by the magnet assembly 302. The magnitude of the magnetic field generated by the electron ExB drift current 310 increases with increased electron ExB drift current 310. The homogeneous diffusion of the high-density plasma in the region 252' is caused, at least in part, by the interaction of the magnetic field 306 generated by the magnet assembly 302 and the magnetic field generated by the electron ExB drift current 310.

In one embodiment, the electron ExB drift current 310 defines a substantially circular shape for low current density plasma. However, as the current density of the plasma increases, the substantially circular electron ExB drift current 310 tends to have a more complex shape as the interaction of the magnetic field 306 generated by the magnet assembly 302, the electric field generated by the high-power pulse, and the magnetic field generated by the electron ExB drift current 310 becomes more acute. For example, in one embodiment, the electron ExB drift current 310 has a substantially cycloidal shape. The exact shape of the electron ExB drift current 310 can be quite elaborate and depends on various factors.

As the magnitude of the electron ExB drift current 310 increases, the magnetic field generated by the electron ExB drift current 310 becomes stronger and eventually overpowers the magnetic field 306 generated by the magnet assembly 302. The magnetic field lines that are generated by the magnet assembly 302 exhibit substantial distortion that is caused by the relatively strong magnetic field that is generated by the relatively large electron ExB drift current 310. Thus, a large electron ExB drift current 310 generates a stronger magnetic field that strongly interacts with and can begin to dominate the magnetic field 306 that is generated by the magnet assembly 302.

The interaction of the magnetic field 306 generated by the magnet assembly 302 and the magnetic field generated by the electron ExB drift current 310 generates magnetic field lines that are somewhat more parallel to the surface of the inner cathode section 202*a* than the magnetic field lines generated by the magnet assembly 302. The somewhat more parallel magnetic field lines allow the high-density plasma to more uniformly distribute itself in the area 252'. Thus, the high-density plasma is substantially uniformly diffused in the area 252'.

Figure 4:
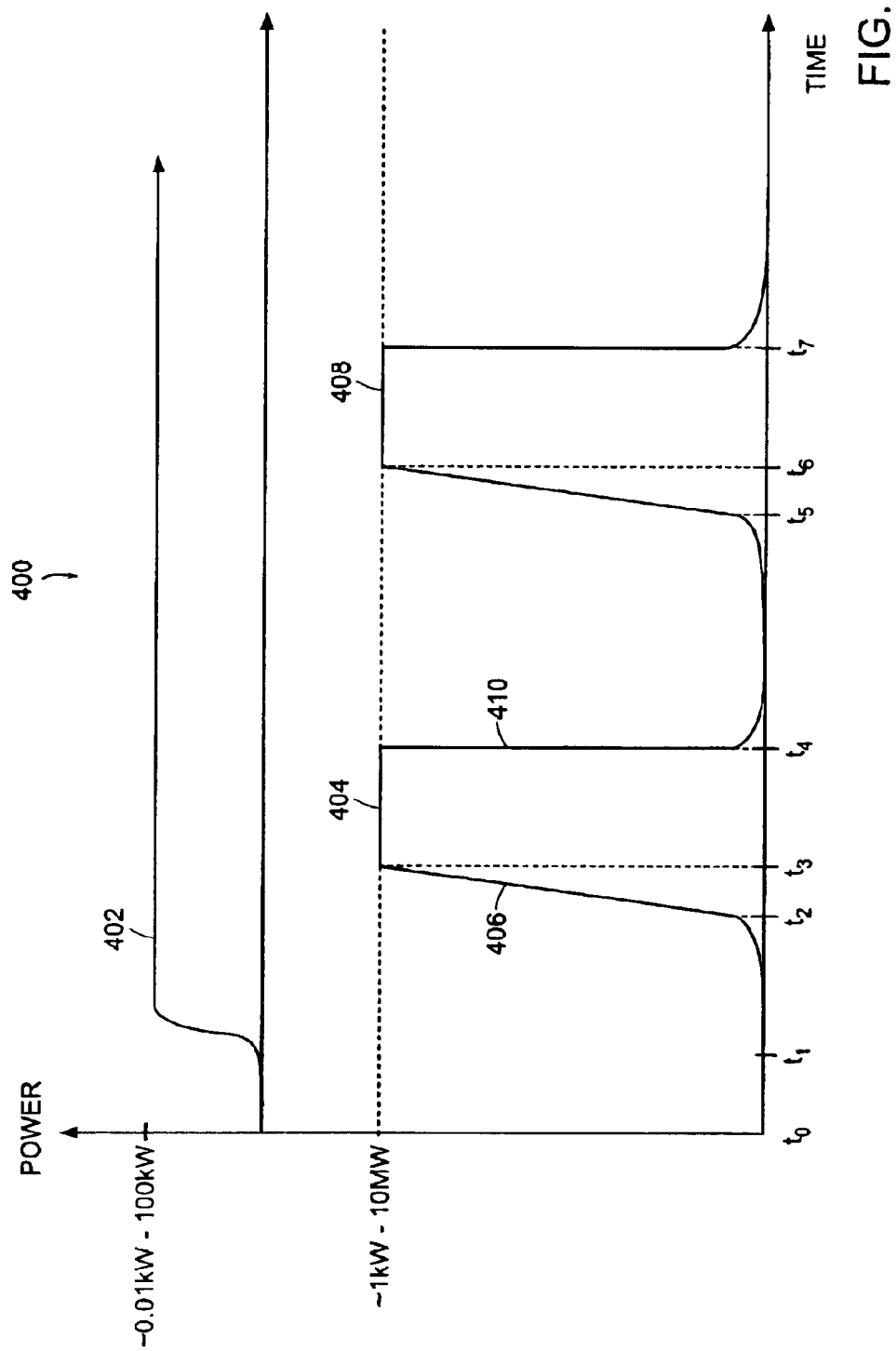
FIG. 4 illustrates a graphical representation of applied power as a function of time for periodic pulses applied to an initial plasma in the plasma generating system of FIG. 2A.

FIG. 4 illustrates a graphical representation 400 of applied power as a function of time for periodic pulses applied to an initial plasma in the plasma generating system 200 of FIG. 2A. The first power supply 206 generates a constant power and the second power supply 222 generates periodic power pulses. In one illustrative embodiment, the feed gas 234 flows into the region 214 between the outer cathode section 202*b* and the first anode 210 at time $t_0$, before either the first power supply 206 or the second power supply 222 are activated.

The time required for a sufficient quantity of feed gas 234 to flow into the region 214 depends on several factors including the flow rate of the feed gas 234 and the desired operating pressure. At time $t_1$, the first power supply 206 generates a power 402 that is in the range of about 0.01 kW to 100 kW and applies the power 402 between the outer cathode section 202*b* and the anode 210. The power 402 causes the feed gas 234 to become at least partially ionized, thereby generating an initial plasma that can be a pre-ionization plasma as previously discussed. An additional volume of feed gas flows into the region 214 (FIG. 2A) between time $t_1$ and time $t_2$ substantially displacing the initial plasma. The initial plasma is displaced into the region 252 proximate to the inner cathode section 202*a*.

At time $t_2$, the second power supply 222 delivers a high-power pulse 404 to the initial plasma that is in the range of about 1 kW to 10 MW depending on the volume and characteristics of the plasma and the operating pressure. The high-power pulse 404 substantially super-ionizes the initial plasma to generate a high-density plasma. The high-power pulse 404 has a leading edge 406 having a rise time from $t_2$ to $t_3$ that is approximately in the range of 0.1 microseconds to ten seconds. In this embodiment, the second power supply 222 is a pulsed power supply. In some embodiments (not shown), the second power supply 222 can be an RF power supply, an AC power supply, or a DC power supply.

In one embodiment, the pulse width of the high-power pulse 404 is in the range of about one microsecond to ten seconds. The high-power pulse 404 is terminated at time $t_4$. In one embodiment, after the delivery of the high-power pulse 404, the power 402 from the first power supply 206 is continuously applied to generate additional plasma from the flowing feed gas 234, while the second power supply 222 prepares to deliver another high-power pulse 408.

At time $t_5$, the second power supply 222 delivers another high-power pulse 408 having a rise time from $t_5$ to $t_6$ and terminating at time $t_7$. In one embodiment, the repetition rate of the high-power pulses is in the range of about 0.1 Hz to 10 kHz. The particular size, shape, width, and frequency of the high-power pulse 408 depend on the process parameters, such as the operating pressure, the design of the second power supply 222, the presence of a magnetic field proximate to the inner cathode section 202*a*, and the volume and characteristics of the plasma, for example. The shape and duration of the leading edge 406 and the trailing edge 410 of the high-power pulse 404 are chosen to control the rate of ionization of the high-density plasma.

In another embodiment (not shown), the first power supply 206 and/or the second power supply 222 are activated at time $t_0$ before the feed gas 234 flows in the region 214. In this embodiment, the feed gas 234 is injected between the outer cathode section 202*b* and the first anode 210 where it is ignited by the first power supply 206 to generate the initial plasma. In this embodiment, the first power supply 202 is a DC power supply. In other embodiments (not shown), the first power supply 202 can an RF power supply, an AC power supply, or a pulsed power supply.

Figure 5:
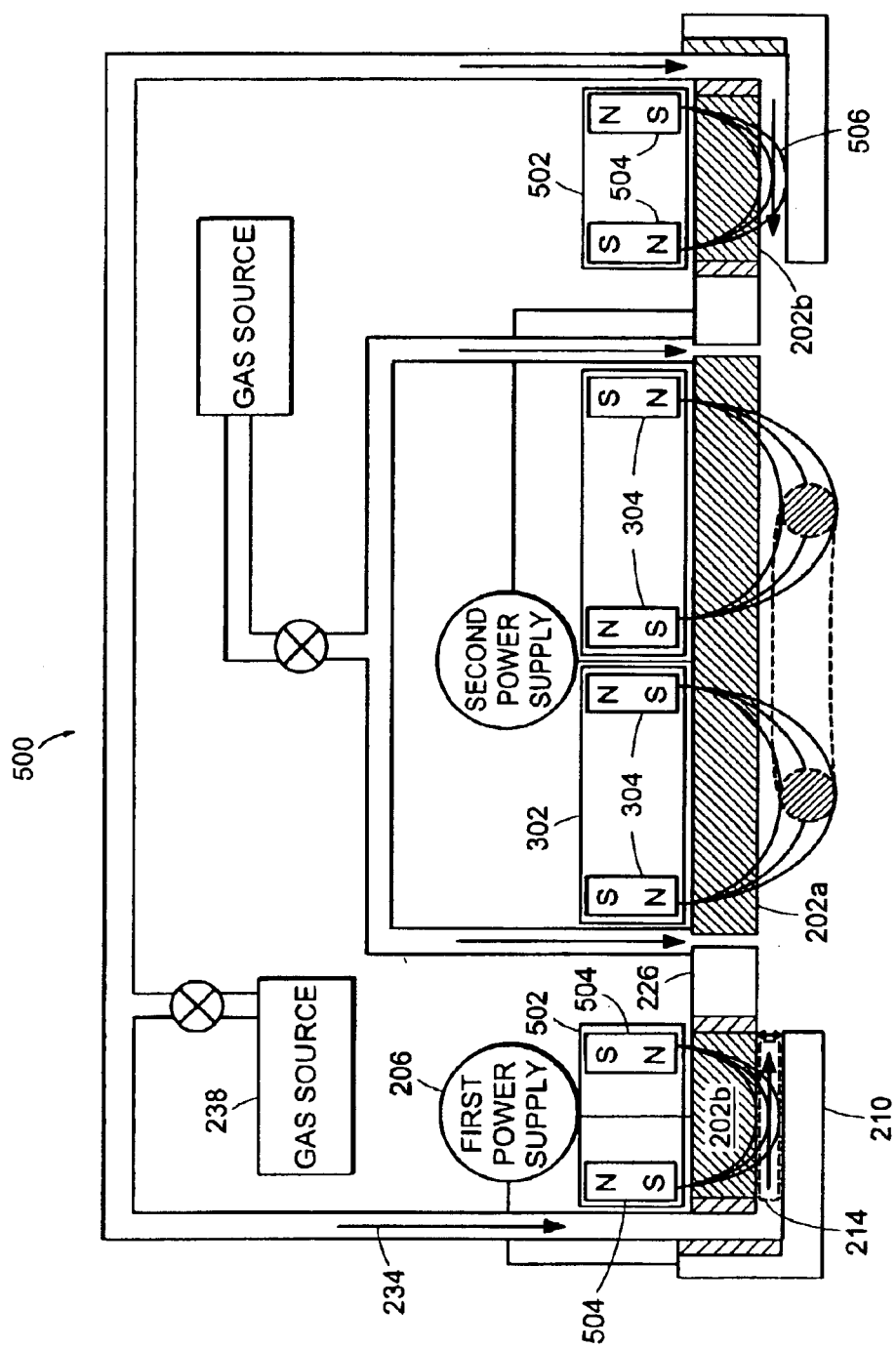
FIG. 5 illustrates a cross-sectional view of a plasma generating apparatus including the magnet assembly of FIG. 3 and an additional magnet assembly according to the invention.

FIG. 5 illustrates a cross-sectional view of a plasma generating apparatus 500 including the magnet assembly 302 of FIG. 3 and an additional magnet assembly 502 according to the invention. The additional magnet assembly 502 can include a permanent magnets 504 as shown, or alternatively, electro-magnets (not shown). In one embodiment, the magnet assembly 502 is adapted to create a magnetic field 506 proximate to the outer cathode section 202*b*. The configuration of the magnet assembly 502 can be varied depending on the desired shape and strength of the magnetic field 506. The magnet assembly 502 can have either a balanced or unbalanced configuration.

In one embodiment, the magnet assembly 502 includes switching electro-magnets, which generate a pulsed magnetic field proximate to the outer cathode section 202*b*. In some embodiments, additional magnet assemblies (not shown) can be placed at various locations around and throughout the process chamber (not shown).

One skilled in the art will appreciate that there are many modes of operating the plasma generating apparatus 500. In one embodiment, the plasma generating apparatus 500 is operated by generating the magnetic field 506 proximate to the outer cathode section 202*b*. In the embodiment shown in FIG. S, the permanent magnets 504 continuously generate the magnetic field 506. In other embodiments, electromagnets (not shown) generate the magnetic field 506 by energizing a current source (not shown) that is coupled to the electro-magnets. In one embodiment, the strength of the magnetic field 506 is in the range of about fifty gauss to two thousand gauss. After the magnetic field 506 is generated, the feed gas 234 from the gas source 238 is supplied between the outer cathode section 202b and the first anode 210. A volume of the feed gas 234 fills in the region 214.

Next, the first power supply 206 generates an electric field across the feed gas 234 to ignite an initial plasma in the region 214. In one embodiment, the magnetic field 506 substantially traps electrons in the initial plasma in the region 214. This causes the initial plasma to remain concentrated in the region 214. In one embodiment, the first power supply 206 applies a high-power pulse across the initial plasma thereby generating a high-density plasma in the region 214.

The high-power pulse energizes the electrons in the initial plasma. The magnetic field 506 causes the electrons to move in a substantially circular manner creating a substantially circular electron ExB drift current (not shown) proximate to the outer cathode section 202b. In one embodiment, the electron ExB drift current generates a magnetic field that interacts with the magnetic field 506 generated by the magnet assembly 502.

The high-power pulses applied between the outer cathode section 202b and the first anode 210 generate secondary electrons from the outer cathode section 202a that move in a substantially circular motion proximate to the inner cathode section 202a according to crossed electric and magnetic fields. The substantially circular motion of the electrons generates the electron ExB drift current. The magnitude of the electron ExB drift current is proportional to the magnitude of the discharge current in the plasma and, in one embodiment, is approximately in the range of between about three and ten times the magnitude of the discharge current. As previously discussed, the electron ExB drift current can improve the homogeneity of the high-density plasma in the region 214.

Figure 6:
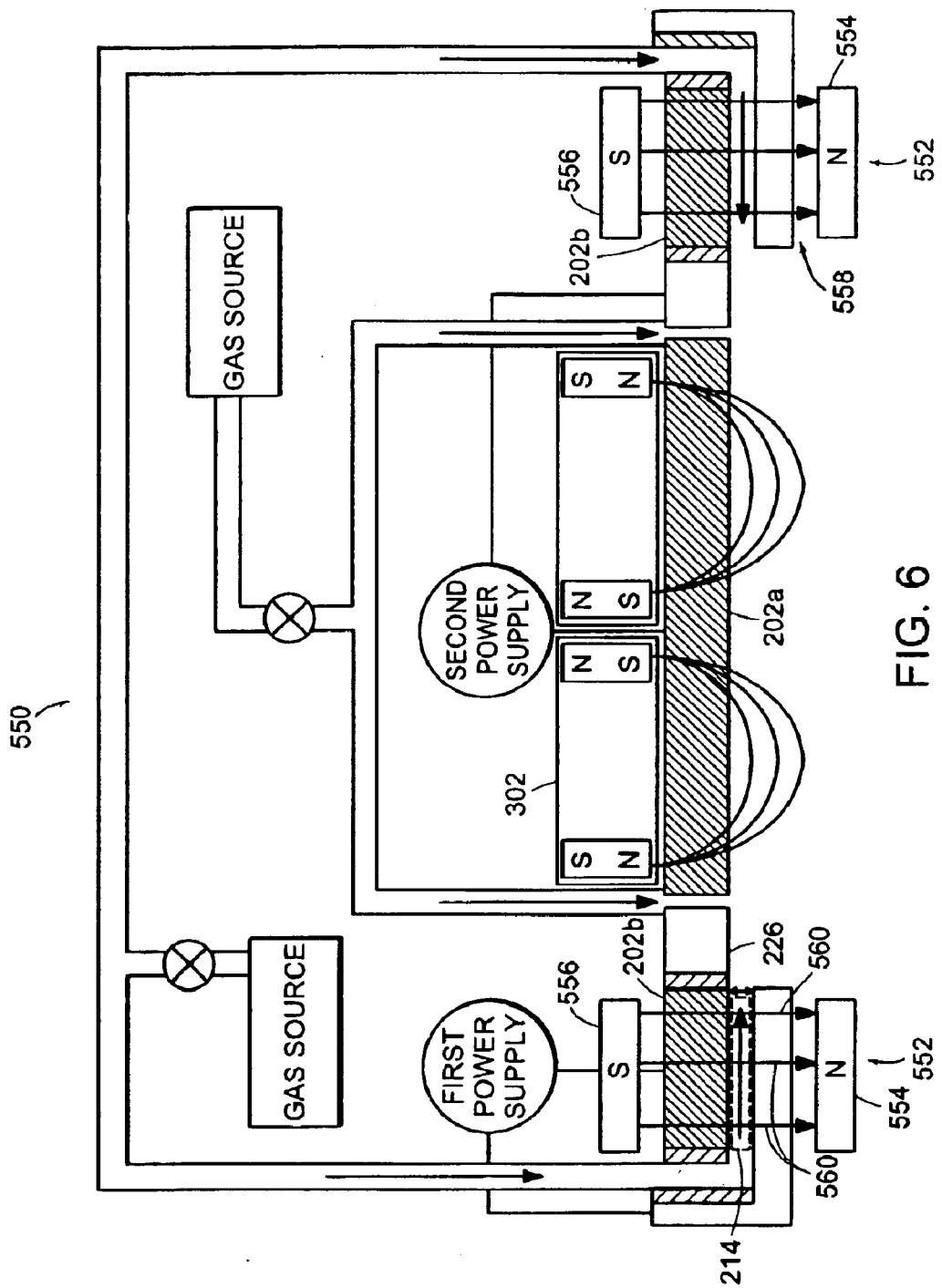
FIG. 6 illustrates a cross-sectional view of a plasma generating apparatus including the magnet assembly of FIG. 3 and an additional magnet assembly according to the invention.

FIG. 6 illustrates a cross-sectional view of a plasma generating apparatus 250 including the magnet assembly 302 of FIG. 3 and an additional magnet assembly 552 according to the invention. The additional magnet assembly 552 can include permanent magnets 554, 556, or alternatively, electromagnets (not shown). In one embodiment, the magnet assembly 552 is adapted to create a magnetic field 558 proximate to the outer cathode section 202b. The configuration of the magnet assembly 552 can be varied depending on the desired shape and strength of the magnetic field 558. The magnet assembly 552 can have either a balanced or unbalanced configuration.

The plasma generating apparatus 550 functions similarly to the plasma generating apparatus 500 of FIG. 5. However, the magnetic assembly 552 that is located proximate to the outer cathode section 202b generates magnetic field lines 560 that are substantially perpendicular to a surface of the outer cathode section 202b. The perpendicular magnetic field lines 560 completely cross the region 214, thereby trapping substantially all of the electrons in the region 214. Thus, the magnetic field 558 can facilitate a more efficient process of generating the initial plasma in the region 214. Skilled artisans will appreciate that alternative magnet configurations can be used within the scope of the invention.

Figure 7:
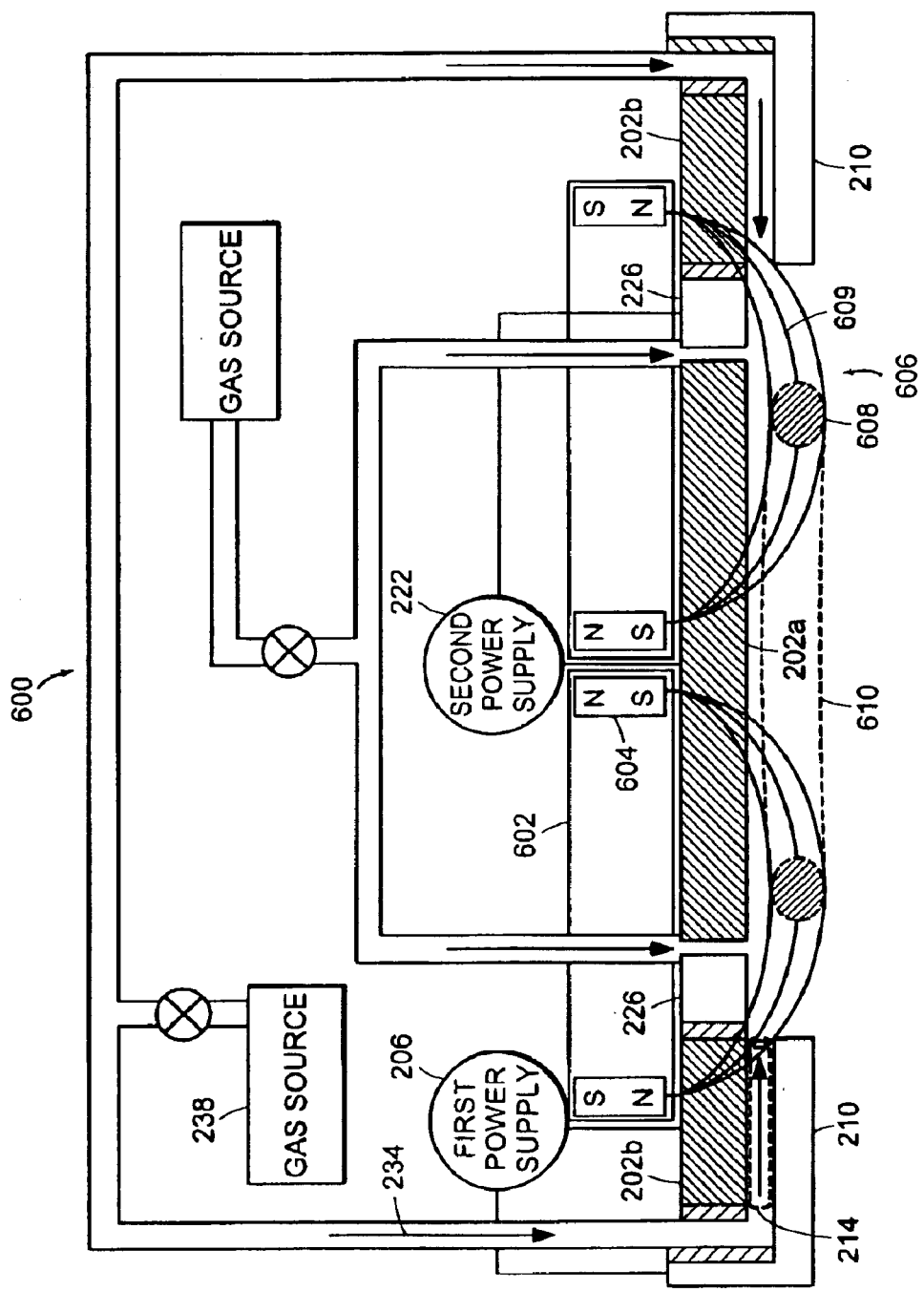
FIG. 7 illustrates a cross-sectional view of another embodiment of a plasma generating apparatus including a magnet assembly according to the invention.

FIG. 7 illustrates a cross-sectional view of another embodiment of a plasma generating apparatus 600 including a magnet assembly 602 according to the invention. The magnet assembly 602 can include permanent magnets 604, or alternatively, electro-magnets (not shown). In one embodiment, the magnet assembly 602 is adapted to create a magnetic field 606 that is located proximate to the inner cathode section 202a and proximate to the outer cathode section 202b. The configuration of the magnet assembly 602 can be varied depending on the desired shape and strength of the magnetic field 606. The magnet assembly 602 can have either a balanced or unbalanced configuration.

In one embodiment, the magnet assembly 602 includes switching electro-magnets, which generate a pulsed magnetic field proximate to the inner 202a and the outer cathode sections 202b. In some embodiments, additional magnet assemblies (not shown) can be placed at various locations around and throughout the process chamber (not shown).

In one embodiment, the permanent magnets 604 continuously generate the magnetic field 606. In other embodiments, electro-magnets (not shown) generate the magnetic field 606 by energizing a current source (not shown) that is coupled to the electro-magnets. In one embodiment, the strength of the magnetic field 606 is in the range of about fifty gauss to two thousand gauss.

In operation, after the magnetic field 606 is generated, the feed gas 234 from the gas source 238 is supplied between the outer cathode section 202b and the first anode 210. A volume of the feed gas 234 fills in the region 214.

Next, the first power supply 206 generates an electric field across the feed gas 234 that ignites an initial plasma in the region 214. In one embodiment, electrons in the initial plasma diffuse from the region 214 to the region 608 substantially along magnetic field lines 609 generated by the magnet assembly 602. In one embodiment, the electrons in the initial plasma are concentrated in the region 608 corresponding to the weakest area of the magnetic field 606 generated by the magnet assembly 602. Thus, the initial plasma is concentrated proximate to the outer edge of the inner cathode section 202a.

The second power supply 222 generates a strong electric field between the second anode 226 and the inner cathode section 202a. The strong electric field super-ionizes the initial plasma to generate a high-density plasma having an ion density that is greater than the ion density of the initial plasma. In one embodiment, the initial plasma has an ion density in the of about $10^7$ to $10^{12}$ cm$^{-3}$. In one embodiment, the high-density plasma has an ion density that is greater than about $10^{12}$ cm$^{-3}$.

In one embodiment, the high-density plasma is used in a magnetron sputtering system (not shown). The magnetron sputtering system includes a target (not shown) that can be integrated into the inner cathode section 202a. Operating parameters can be chosen such that the outer edge of the target is eroded at a relatively high rate compared with the center of the target because the high-density plasma is concentrated in the region 608. Thus, a sputtering system according to the present invention can include a target that is relatively small compared with known sputtering systems for similarly sized substrates (not shown). In addition, the power level of the high-power pulse can be chosen such that the high-density plasma can be homogeneously distributed across the target as described herein.

The magnetic field 606 can improve the homogeneity of the high-density plasma and can increase the ion density of the high-density plasma by trapping electrons in the initial plasma and also trapping secondary electrons proximate to the target. The trapped electrons ionize excited atoms in the initial plasma thereby generating the high-density plasma. The magnetic field 606 also promotes increased homogeneity of the high-density plasma by setting up an electron ExB drift current 610 proximate to the target. In one embodiment, the electron ExB drift current 610 generates a magnetic field that interacts with the magnetic field 606 generated by the magnet assembly 602 as described herein.

Figure 8:
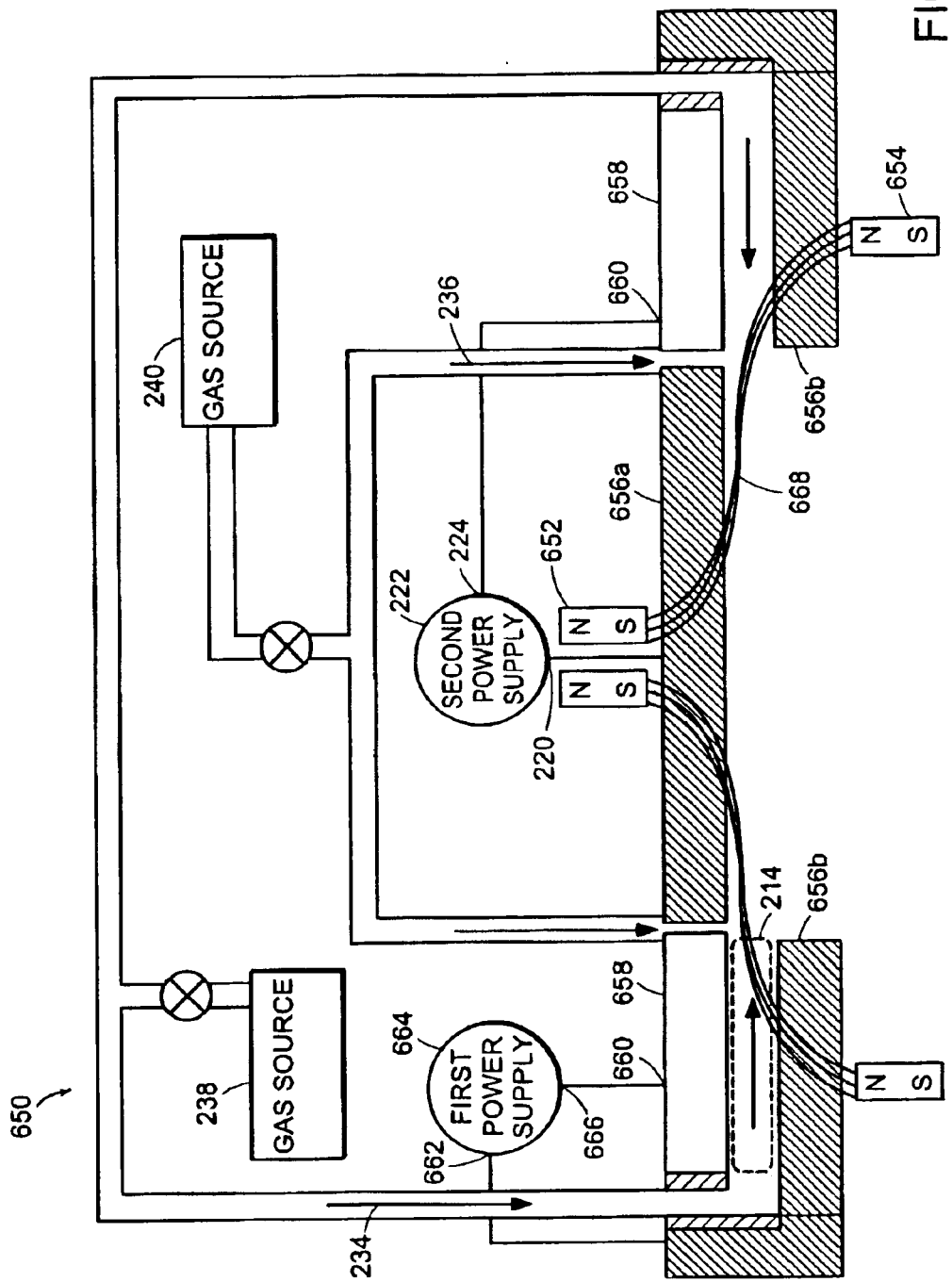
FIG. 8 illustrates a cross-sectional view of a plasma generating apparatus including a magnet configuration that includes a first magnet and a second magnet according to the invention.

FIG. 8 illustrates a cross-sectional view of a plasma generating apparatus 650 including a magnet configuration that includes a first magnet 652 and a second magnet 654 according to the invention. The first 652 and the second magnets 654 can be any type of magnet, such as a permanent ring-shaped magnet or an electromagnet, for example.

The plasma generating apparatus 650 also includes a segmented cathode 656. The segmented cathode 656 (656a, b) includes an inner cathode section 656a and an outer cathode section 656b. The outer cathode section 656b Is disposed generally opposite to the inner cathode section 656a, but can be offset as shown in FIG. 8. The segmented cathode 656 illustrated in FIG. 8 can reduce sputtering contamination compared with known cathodes used in sputtering systems because both the inner cathode section 656a and the outer cathode section 656b can include target material (not shown). Consequently, any material that is sputtered from the outer cathode section 656b is target material instead of cathode material that could contaminate the sputtering process.

The plasma generating apparatus 650 also includes an anode 658. The anode 658 is disposed proximate to the inner cathode section 656a and the outer cathode section 656b. In one embodiment, the first output 220 of the second power supply 222 is coupled to the inner cathode section 656a and the second output 224 of the second power supply 222 is coupled to an input 660 of the anode 658.

In one embodiment, a first output 662 of a first power supply 664 is coupled to the outer cathode section 656b. A second output 666 of the first power supply 664 is coupled to the input 660 of the anode 658. In one embodiment (not shown), the anode 658 is coupled to ground potential and the second output 224 of the second power supply 222 as well as the second output 666 of the first power supply 664 are also coupled to ground potential.

The plasma generating apparatus 650 operates in a similar manner to the plasma generating apparatus 200 of FIG. 2A. However, the magnetic field 668 generated by the first 652 and the second magnets 654 is substantially parallel to at least a portion of the surface of the inner cathode section 656a. The shape of the magnetic field 668 can result in a homogeneous plasma volume that is located proximate to the inner cathode section 656a as discussed herein. Additionally, the magnetic field 668 traps substantially all of the secondary electrons from the inner 656a and the outer cathode sections 656b due to the configuration of the first 652 and the second magnets 654.

In one mode of operation, feed gas 234 from the gas source 238 flows in the region 214 between the anode 658 and the outer cathode section 656b. In some embodiments, the feed gas source 240 supplies feed gas 236 between the inner cathode section 656a and the anode 658. The first power supply 664 generates an electric field across the feed gas 234 that generates an initial plasma in the region 214. Electrons in the initial plasma diffuse along the magnetic field lines of the magnetic field 668. Due to the configuration of the magnets 652 and 654, substantially all of the electrons in the initial plasma are trapped by the magnetic field 668. The initial plasma diffuses towards the inner cathode section 656a as the feed gas 234 continues to flow.

After a suitable volume of the initial plasma is located proximate to the inner cathode section 656a, the second power supply 222 generates a strong electric field between the inner cathode section 656a and the anode 658. The strong electric field super-ionizes the initial plasma and generates a high-density plasma having an ion density that is higher than the ion density of the initial plasma.

Figure 9:
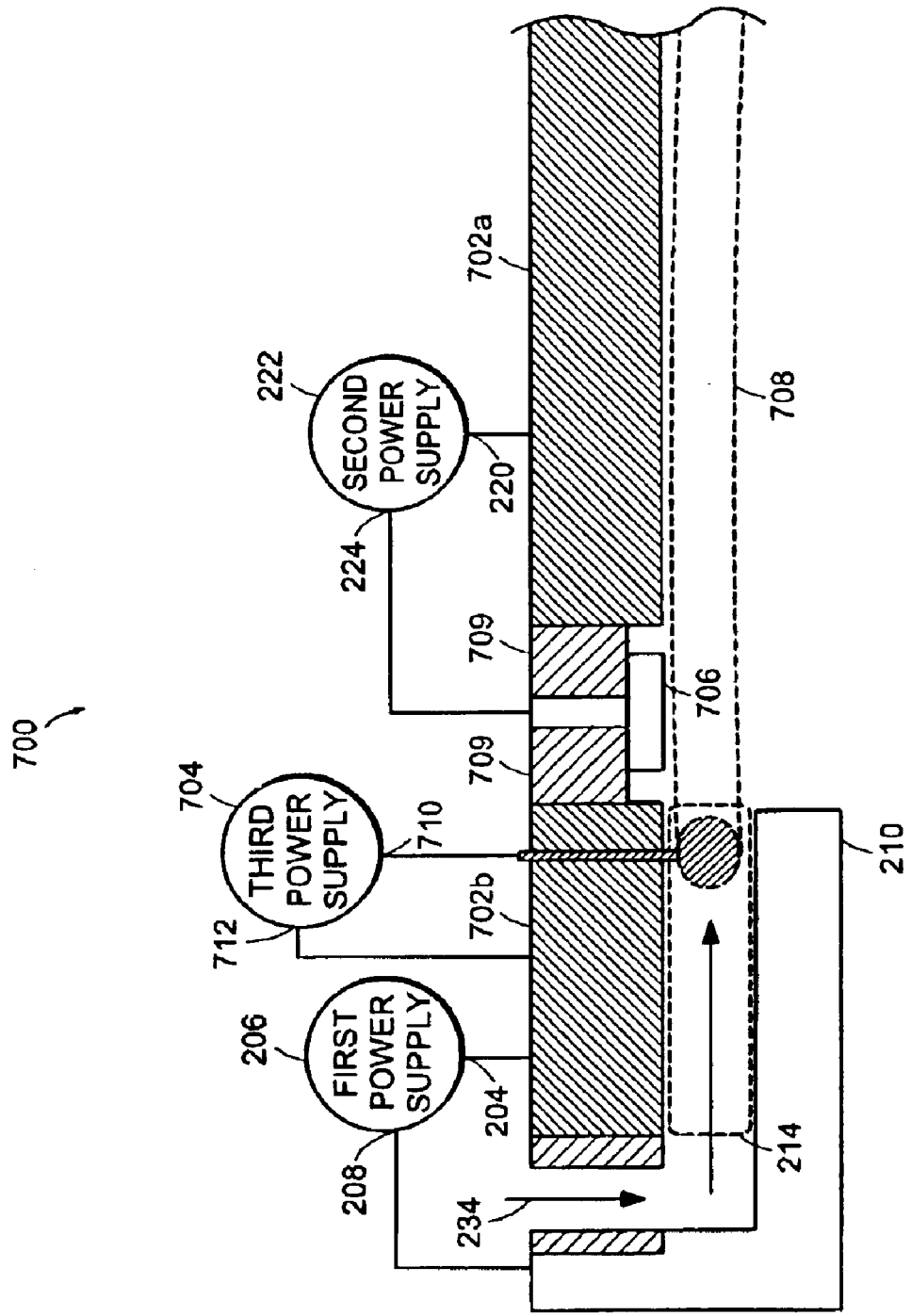
FIG. 9 illustrates a cross-sectional view of a plasma generating apparatus according to the present invention including a segmented cathode assembly, an ionizing electrode, and a first, a second and a third power supply.

FIG. 9 illustrates a cross-sectional view of a plasma generating apparatus 700 according to the present invention including a segmented cathode assembly 702 (702a, b), an ionizing electrode 708, and a first 206, a second 222 and a third power supply 704. The first 206, the second 222, and the third power supplies 704 can each be any type of power supply suitable for plasma generation, such as a pulsed power supply, a RF power supply, a DC power supply, or an AC power supply. In some embodiments, the first 206, the second 222, and/or the third power supplies 704 operate in a constant power or constant voltage mode as described herein.

Only one portion of the segmented cathode assembly 702 is shown for illustrative purposes. In one embodiment, the portion that is not shown in FIG. 9 is substantially symmetrical to the portion shown in FIG. 9. The plasma generating apparatus 700 also includes a first anode 210 and a second anode 706. In one embodiment, the ionizing electrode 708 is a filament-type electrode. The ionizing electrode 708 can be ring-shaped or any other shape that is suitable for generating an initial plasma in the region 214. Isolators 709 insulate the inner cathode section 702a from the outer cathode section 702b. The isolators 709 also insulate the second anode 706 from the inner 702a and the outer cathode sections 702b.

A first output 710 of the third power supply 704 is coupled to the ionizing electrode 708. A second output 712 of the third power supply 704 is coupled to the outer cathode section 702b. The power generated by the third power supply 704 is sufficient to ignite a feed gas 234 located in the region 214 to generate an initial plasma.

The first output 204 of the first power supply 206 is coupled to the outer cathode section 702b. The second output 208 of the first power supply 206 is coupled to the first anode 210. The power generated by the first power supply 206 is sufficient to increase the ion density of the initial plasma in the region 214.

The first output 220 of the second power supply 222 is coupled to the inner cathode section 702a. The second output 224 of the second power supply 222 is coupled to the second anode 706.

In operation, the first power supply 206 is a pulsed power supply that applies a high-power pulse between the outer cathode section 702b and the first anode 210. The high-power pulse generates an electric field (not shown) through the region 214. The electric field generates a high-density plasma from the initial plasma that is generated by the ionizing electrode 708. The high-density plasma is generally more strongly ionized than the initial plasma.

In one embodiment, the feed gas 234 continues to flow after the high-density plasma is generated in the region 214. The feed gas 234 displaces the high-density plasma towards the inner cathode region 702a. The feed gas exchange continues until a suitable volume of the high-density plasma is located proximate to the inner cathode section 702a.

In one embodiment, the second power supply 222 is a pulsed power supply that applies a high-power pulse across the high-density plasma. The high-power pulse generates an electric field (not shown) between the inner cathode section 702a and the second anode 706. The electric field generates a plasma that is generally more strongly-ionized than the high-density plasma.

The plasma generating apparatus 700 of the present invention generates a very high-density plasma using standard power supplies. The plasma generating apparatus 700 of the present invention can generate a very high-density plasma at a lower cost compared with a known plasma generating apparatus because the plasma generating apparatus 700 can use relatively inexpensive and commercially available power supplies. In plasma sputtering applications, the sputtering targets that are used in the plasma generating apparatus 700 can be much smaller relative to comparable sputtering targets that are used in known magnetron sputtering systems used to process similarly sized substrates.

Figure 10:
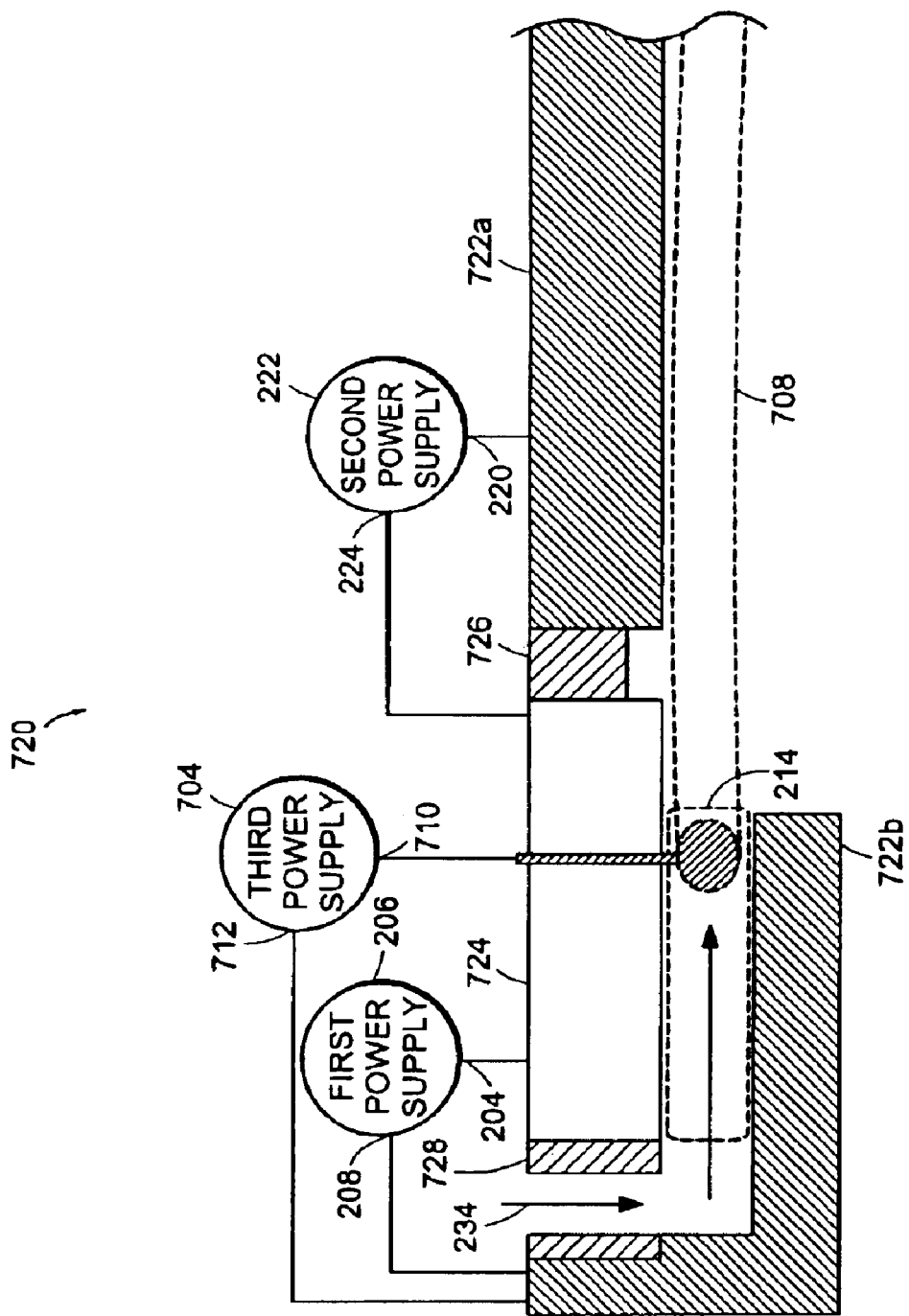
FIG. 10 illustrates a cross-sectional view of a plasma generating apparatus according to the present invention including a segmented cathode assembly, a common anode, an ionizing electrode and a first, a second and a third power supply.

FIG. 10 illustrates a cross-sectional view of a plasma generating apparatus 720 according to the present invention including a segmented cathode assembly 722 (722*a, b*), a common anode 724, an ionizing electrode 708, and a first 206, a second 222, and a third power supply 704. The first 206, the second 222, and the third power supplies 704 can each be any type of power supply suitable for plasma generation, such as a pulsed power supply, a RF power supply, a DC power supply, or an AC power supply. In some embodiments, the first 206, the second 222, and/or the third power supplies 704 operate in a constant power or constant voltage mode as described herein.

Only one portion of the segmented cathode assembly 722 is shown for illustrative purposes. In one embodiment, the portion that is not shown in FIG. 10 is substantially symmetrical to the portion shown in FIG. 10. In one embodiment, the ionizing electrode 708 is a filament-type electrode. The ionizing electrode 708 can be ring-shaped or any other shape that is suitable for generating an initial plasma in the region 214. An isolator 726 insulates the anode 724 from the inner cathode section 722*a*. An isolator 728 insulates the anode 724 from the outer cathode section 722*b*.

In a plasma sputtering configuration, the segmented cathode assembly 722 illustrated in FIG. 10 can reduce sputtering contamination compared with known cathodes used in sputtering systems because both the inner cathode section 722*a* and the outer cathode section 722*b* can include target material (not shown). Consequently, any material that is sputtered from the outer cathode section 722*b* is target material instead of cathode material that could contaminate the sputtering process.

A first output 710 of the third power supply 704 is coupled to the ionizing electrode 708. A second output 712 of the third power supply 704 is coupled to the outer cathode section 722*b*. The power generated by the third power supply 704 is sufficient to ignite a feed gas 234 located in the region 214 to generate an initial plasma.

The first output 204 of the first power supply 206 is coupled to the anode 724. The second output 208 of the first power supply 206 is coupled to the outer cathode, section 722*b*. The power generated by the first power supply 206 is sufficient to increase the ion density of the initial plasma in the region 214.

The first output 220 of the second power supply 222 is coupled to the inner cathode section 722*a*. The second output 224 of the second power supply 222 is coupled to the anode 724.

In operation, the first power supply 206 is a pulsed power supply that applies a high-power pulse between the outer cathode section 722*b* and the anode 724. The high-power pulse generates an electric field through the region 214. The electric field generates a high-density plasma from the initial plasma. The high-density plasma is generally more strongly ionized than the initial plasma.

In one embodiment, the feed gas 234 continues to flow after the high-density plasma is generated in the region 214. The feed gas 234 displaces the high-density plasma towards the inner cathode region 722*a*. The feed gas exchange continues until a suitable volume of the high-density plasma is located proximate to the inner cathode section 722*a*;

In one embodiment, the second power supply 222 is a pulsed power supply that applies a high-power pulse across the high-density plasma. The high-power pulse generates a strong electric field between the inner cathode section 722*a* and the anode 724. The strong electric field generates a plasma that is generally more strongly-ionized than the high-density plasma.

Figure 11:
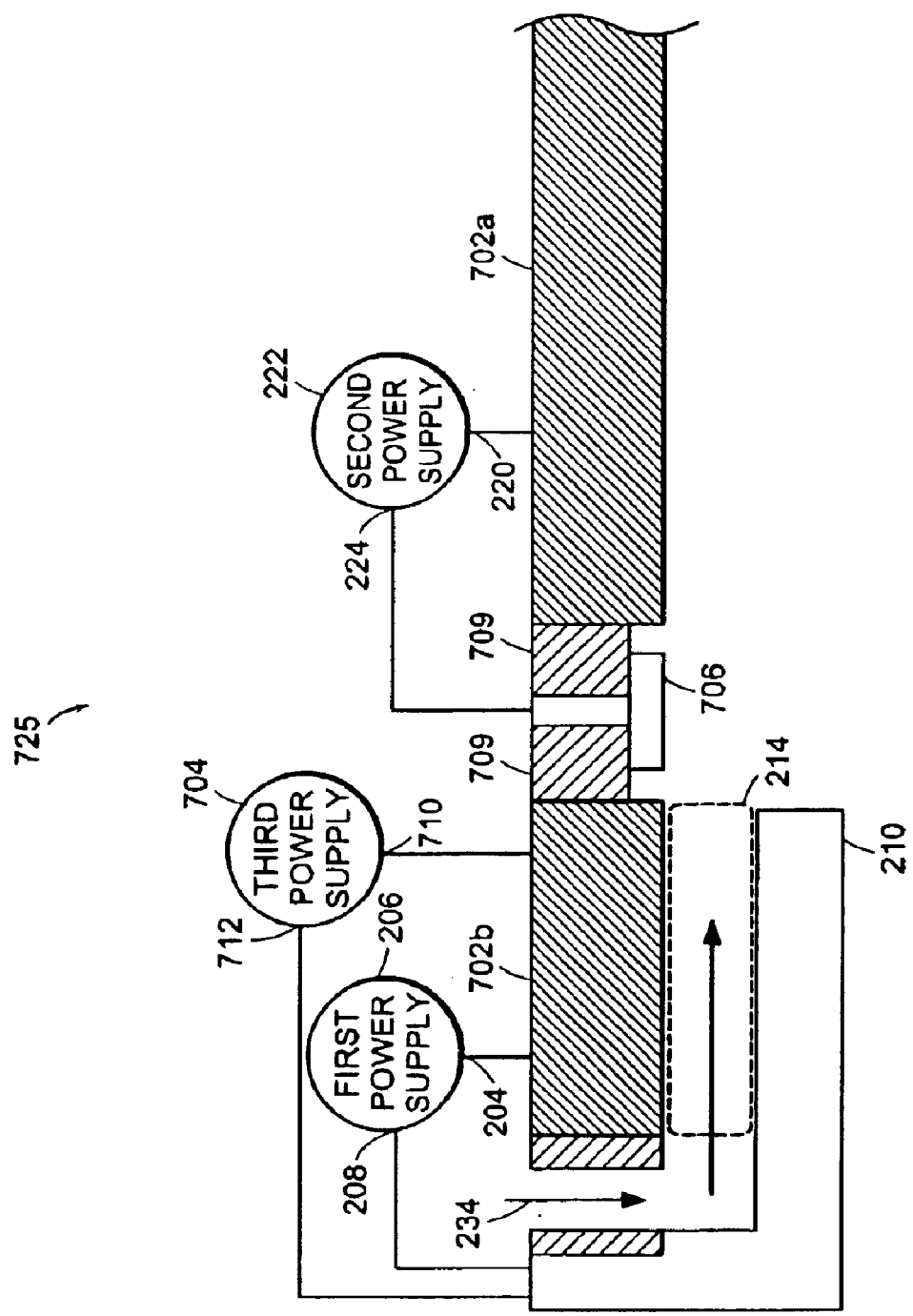
FIG. 11 illustrates a cross-sectional view of a plasma generating apparatus according to the present invention including a segmented cathode assembly and a first, a second and a third power supply.

FIG. 11 illustrates a cross-sectional view of a plasma generating apparatus 72S according to the present invention including the segmented cathode assembly 702 (702*a, b*) and a first 206, a second 222 and a third power supply 704. The first 206, the second 222, and the third power supplies 704 can each be any type of power supply suitable for plasma generation, such as a pulsed power supply, a RF power supply, a DC power supply, or an AC power supply. In some embodiments, the first 206, the second 222, and/or the third power supplies 704 operate in a constant power or constant voltage mode as described herein. The first 206 and the third power supplies 704 can be integrated into a single power supply.

Only one portion of the segmented cathode assembly 702 is shown for illustrative purposes. In one embodiment, the portion that is not shown in FIG. 11 is substantially symmetrical to the portion shown in FIG. 11. The plasma generating apparatus 725 also includes a first anode 210 and a second anode 706. Isolators 709 insulate the inner cathode section 702*a* from the outer cathode section 702*b* and insulate the second anode 706 from the inner 702*a* and the outer cathode sections 702*b*.

A first output 710 of the third power supply 704 is coupled to the outer cathode section 702*b*. A second output 712 of the third power supply 704 is coupled to the first anode 210. The power generated by the third power supply 704 is sufficient to ignite a feed gas 234 located in the region 214 to generate an initial plasma.

A first output 204 of the first power supply 206 is coupled to the outer cathode section 702*b*. A second output 208 of the first power supply 206 is coupled to the first anode 210. A first output 220 of the second power supply 222 is coupled to the inner cathode section 702*a*. A second output 224 of the second power supply 222 is coupled to the second anode 706.

In operation, the power generated by the first power supply 206 is sufficient to increase the ion density of the initial plasma in the region 214 that is generated by the third power supply 704. In one embodiment, the first power supply 206 is a pulsed power supply that applies a high-power pulse between the outer cathode section 702*b* and the first anode 210. The high-power pulse generates an electric field through the region 214. The electric field generates a high-density plasma from the initial plasma. The high-density plasma is generally more strongly ionized than the initial plasma.

In one embodiment, the feed gas 234 continues to flow after the high-density plasma is generated in the region 214. The feed gas 234 displaces the high-density plasma towards the inner cathode region 702*a*. The feed gas exchange continues until a suitable volume of the high-density plasma is located proximate to the inner cathode section 702*a*.

In one embodiment, the second power supply 222 is a pulsed power supply that applies a high-power pulse across the high-density plasma. The high-power pulse generates a strong electric field between the inner cathode section 702*a* and the second anode 706. The strong electric field generates a plasma that is generally more strongly-ionized than the high-density plasma.

The plasma generating apparatus 725 of the present invention generates a very high-density plasma using standard power supplies. The plasma generating apparatus 725 of the present invention can generate a very high-density plasma at a lower cost compared with a known plasma generating apparatus because the plasma generating apparatus 725 can use relatively inexpensive and commercially available power supplies.

There are many modes of operation for the plasma generating apparatus 725. For example, the first power supply 206 and the second power supply 222 can both be operated in constant power mode. In another mode of operation, the first power supply 206 is operated in constant power mode and the second power supply 222 is operated in constant voltage mode. In still another mode of operation, the first 206 and the second power supplies 222 are both operated in constant voltage mode. Some of these modes of operation are discussed in more detail herein.

Figure 12:
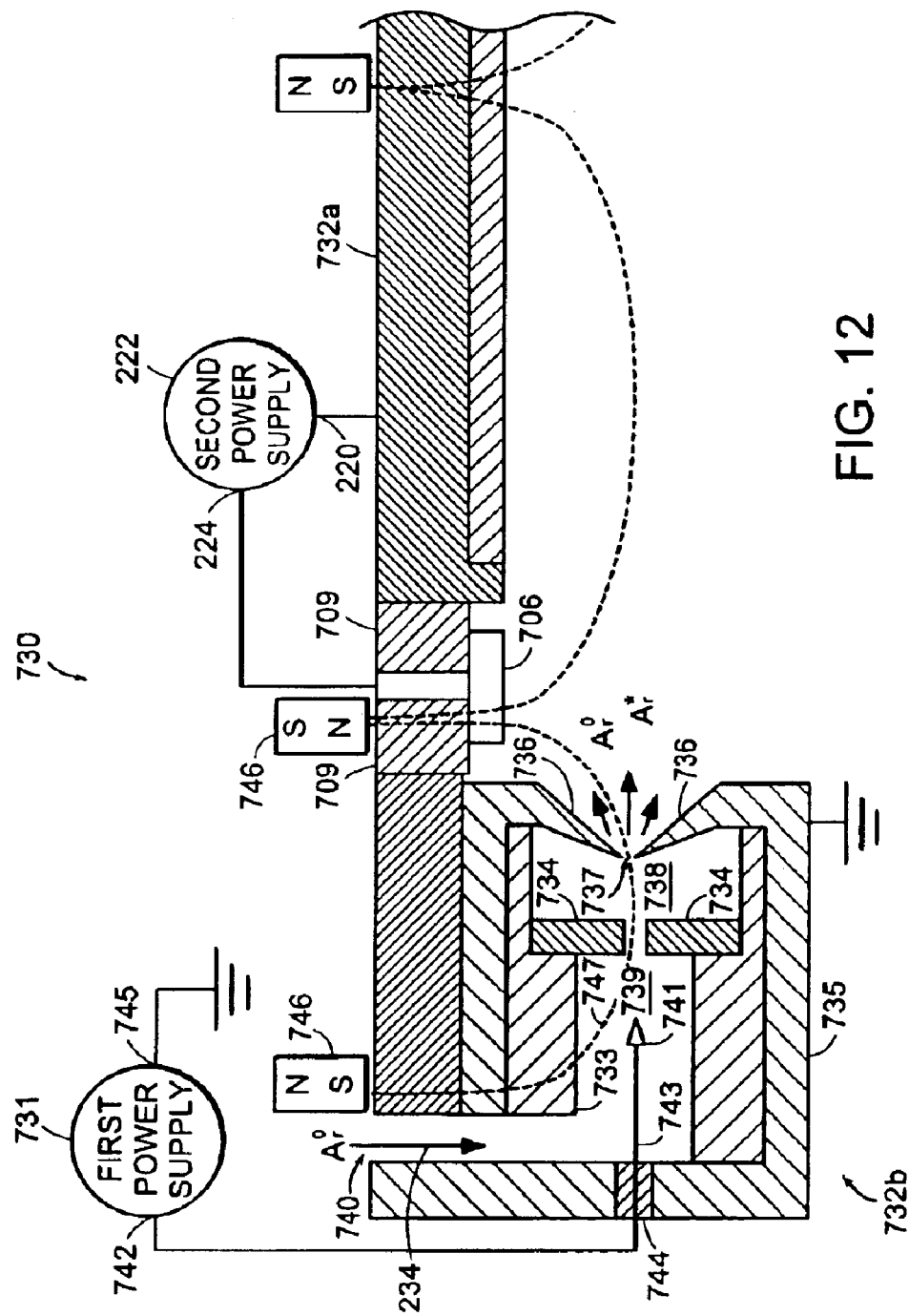
FIG. 12 illustrates a cross-sectional view of a plasma generating apparatus according to the present invention including a segmented cathode assembly, an excited atom source, and a first, and a second power supply.

FIG. 12 illustrates a cross-sectional view of a plasma generating apparatus 730 according to the present invention including a segmented cathode assembly 732 (732a, b), a second anode 706, a first 731 and a second power supply 222. In this embodiment, the outer cathode section is in the form of an excited atom source 732b. The excited atom source 732b generates excited atoms including metastable atoms from ground state atoms in the feed gas 234. In another embodiment (not shown), the outer cathode section 732b is in the form of a hollow cathode. Skilled artisans will appreciate that multiple excited atom sources (not shown) can surround the inner cathode section 732a.

The first 731 and the second power supplies 222 can be any type of power supplies suitable for plasma generation, such as pulsed power supplies, RF power supplies, DC power supplies, or AC power supplies. In some embodiments, the first 731 and/or the second power supplies 222 operate in a constant power or constant voltage mode as described herein.

Only one portion of the segmented cathode assembly 732 is shown for illustrative purposes. In one embodiment, the portion that is not shown is substantially symmetrical to the portion shown in FIG. 12. The inner cathode section 732a can be electrically isolated from the excited atom source 732b. Isolators 709 insulate the second anode 706 from the inner cathode section 732a and the excited atom source 732b.

The excited atom source 732b includes a tube 733. The tube 733 can be formed of non-conducting material, such as a dielectric material, like boron nitride or quartz, for example. A nozzle 734 is positioned at one end of the tube 733. The nozzle 734 can be formed from a ceramic material. The tube 733 is surrounded by an enclosure 735. A skimmer 736 having an aperture 737 is positioned adjacent to the nozzle 734 forming a nozzle chamber 738. The skimmer 736 can be connected to the enclosure 735. In one embodiment, the skimmer 736 is cone-shaped as shown in FIG. 12. In one embodiment, the enclosure 735 and the skimmer 736 are electrically connected to ground potential.

The tube 733 and the enclosure 735 define an electrode chamber 739 that is in fluid communication with a gas inlet 740. A feed gas source (not shown) is coupled to the gas inlet 740 so as to allow feed gas 234 to flow into the electrode chamber 739. An electrode 741 is positioned inside the electrode chamber 739 adjacent to the nozzle 734 and to the skimmer 736. In one embodiment, the electrode 741 is a needle electrode, as shown in FIG. 12. The needle electrode generates a relatively high electric field at the tip of the electrode. The electrode 741 is electrically isolated from the skimmer 736.

A first output 742 of the first power supply 731 is coupled to the needle electrode 741 with a transmission line 743. An insulator 744 isolates the transmission line 743 from the grounded enclosure 735. A second output 745 of the first power supply 737 is coupled to ground.

A first output 220 of the second power supply 222 is coupled to the inner cathode section 732a. A second output 224 of the second power supply 222 is coupled to the second anode 706. In one embodiment, the second power supply 222 generates an electric field between the inner cathode section 732a and the second anode 706.

The plasma generating apparatus 730 of the present invention generates a high-density plasma using standard power supplies. The plasma generating apparatus 730 of the present invention can generate a high-density plasma at a lower cost compared with known plasma generating apparatus because the plasma generating apparatus 730 can use relatively inexpensive and commercially available power supplies. In addition, the sputtering targets that can be used in the plasma generating apparatus 730 can be much smaller relative to comparable sputtering targets that are used in known magnetron sputtering systems used to process similarly sized substrates.

There are many modes of operation for the plasma generating apparatus 730. For example, the first power supply 731 and the second power supply 222 can both be operated in constant power mode. In another mode of operation, the first power supply 731 is operated in constant power mode and the second power supply 222 is operated in constant voltage mode. In still another mode of operation, the first 731 and the second power supplies 222 are both operated in constant voltage mode. Some of these modes of operation are discussed in more detail herein.

In one illustrative mode of operation, ground state atoms in the feed gas 234 are supplied to the excited atom source 732b through the gas inlet 740. The pressure in the electrode chamber 739 is optimized to produce exited atoms including metastable atoms by adjusting parameters, such as the flow rate of the feed gas 234, the diameter of the nozzle 734, and the diameter of the aperture 737 of the skimmer 736. The first power supply 731 generates an electric field (not shown) between the needle electrode 741 and the skimmer 736. The electric field raises the energy of the ground state atoms to an excited state that generates excited atoms. Many of the excited atoms are metastable atoms. The electric field can also generate some ions and electrons along with the exited atoms.

Optional magnets 746 generate a magnetic field 747 proximate to the excited atom source 732b. The magnetic field 747 can be used to assist in exciting the ground state atoms. The magnetic field 747 traps accelerated electrons proximate to the electric field. Some of the accelerated electrons impact a portion of the ground state atoms, thereby transferring energy to those ground state atoms. This energy transfer excites at least a portion of the ground state atoms to create a volume of excited atoms including metastable atoms.

A portion of the volume of excited atoms as well as some ions, electrons and ground state atoms flow through the nozzle 734 into the nozzle chamber 738 as additional feed gas flows into the electrode chamber 739. A large fraction of the ions and electrons are trapped in the nozzle chamber 738 while the excited atoms and the ground state atoms flow through the aperture 737 of the skimmer 736.

After a sufficient volume of excited atoms including metastable atoms is present proximate to the inner cathode section 732a, the second power supply 222 generates an electric field (not shown) proximate to the volume of excited atoms between the inner cathode section 732a and the second anode 706. The electric field raises the energy of the volume of excited atoms causing collisions between neutral atoms, electrons, and excited atoms including metastable atoms. These collisions generate the plasma proximate to the inner cathode section 732a. The plasma includes ions, excited atoms and additional metastable atoms. The efficiency of this multi-step ionization process increases as the density of excited atom and metastable atoms increases.

In one embodiment, a magnetic field is generated proximate to the inner cathode section 732a. The magnetic field can increase the ion density of the plasma by trapping electrons in the plasma and also by trapping secondary electrons proximate to the inner cathode section 732a.

All noble gas atoms have metastable states. For example, argon metastable atoms can be generated by a multi-step ionization process. In a first step, ionizing electrons e⁻ are generated by applying a sufficient voltage across argon feed gas containing ground state argon atoms. When an ionizing electron e⁻ collides with a ground state argon (Ar) atom, a metastable argon atom and an electron are generated. Argon has two metastable states, see Fabrikant, I. I., Shpenik, O. B., Snegursky, A. V., and Zavilopulo, A. N., *Electron Impact Formation of Metastable Atoms*, North-Holland, Amsterdam. In a second step in the multi-step ionization process, the metastable argon atom is ionized.

The multi-step ionization process described herein substantially increases the rate at which the plasma is formed and, therefore, generates a relatively dense plasma. The rate is increased because only a relatively small amount of energy is required to ionize the metastable atoms as described herein. For example, ground state argon atoms require energy of about 15.76 eV to ionize. However, argon metastable atoms require only about 4 eV of energy to ionize. The excited atom source 732b provides the energies of about 11.55 eV and 11.72 eV that are necessary to reach argon metastable states. Therefore, a volume of metastable atoms will ionize at a much higher rate than a similar volume of ground state atoms for the same input energy.

Furthermore, as the density of the metastable atoms in the plasma increases, the efficiency of the ionization process rapidly increases. The increased efficiency results in an avalanche-like process that substantially increases the density of the plasma. In addition, the ions in the plasma strike the inner cathode section 732a causing secondary electron emission from the inner cathode section 732a. The secondary electrons interact with ground state atoms and with the excited atoms including the metastable atoms in the plasma. This interaction further increases the density of ions in the plasma as additional volumes of metastable atoms become available. Thus, for the same input energy, the density of the plasma that is generated by the multi-step ionization process according to the present invention is significantly greater than a plasma that is generated by direct ionization of ground state atoms.

Figure 13:
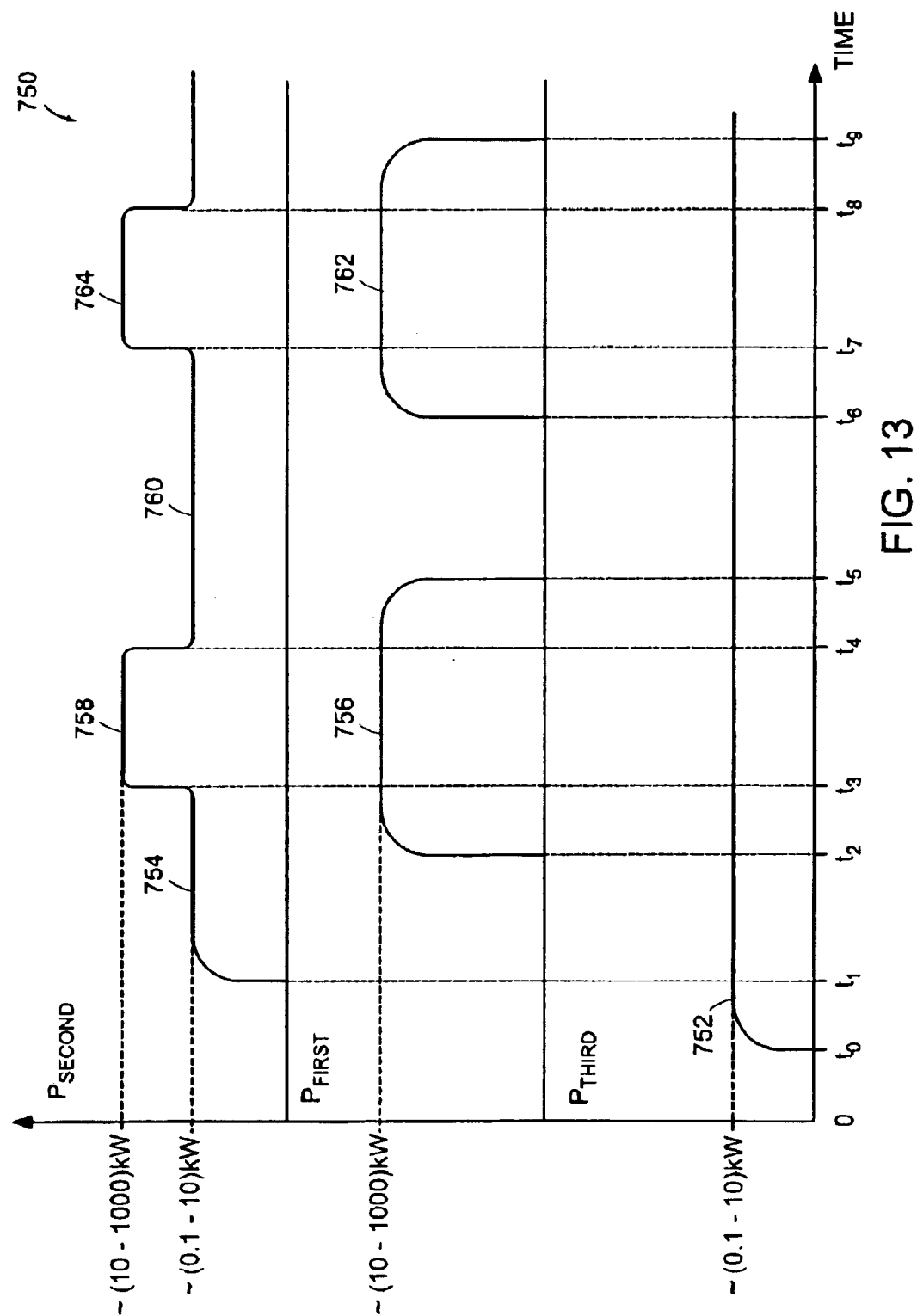
FIG. 13 illustrates a graphical representation of the power as a function of time for each of a first, a second and a third power supply for one mode of operating the plasma generating system of FIG. 9.

FIG. 13 illustrates a graphical representation 750 of power as a function of time for each of a first 206, a second 222, and a third power supply 704 for one mode of operating the plasma generating system 700 of FIG. 9. The first 206, second 222, and third power supplies 704 are synchronized to each other to optimize certain properties of the plasma. For example, the third power supply 704 generates a constant power throughout the process, while the first 206 and the second power supplies 222 generate periodic power pulses at preset intervals. Although FIG. 13 relates to the operation of FIG. 9, skilled artisans will appreciate that the plasma generating systems 720, 725 of FIG. 10 and FIG. 11, respectively, can be operated in a similar manner to the plasma generating system 700 of FIG. 9. In one mode of operation, the first power supply 206 and the second power supply 222 are operated in a constant power mode.

In this mode, the plasma generating apparatus 700 can operate as follows. At time $t_0$, the third power supply 704 applies a constant power 752 in the range of about 0.1 kW to 10 kW across the feed gas 234 to generate an initial plasma. The power level required to generate the initial plasma depends on several factors including the dimensions of the region 214, for example. The constant power 752 is applied between the ionizing electrode 708 and the outer cathode section 702b. The initial plasma diffuses towards the inner cathode section 702a due to a pressure differential as described herein. The pressure differential concentrates the initial plasma from the region 214 towards the inner cathode section 702a.

At time $t_1$ the second power supply 222 applies a constant power 754 in the range of about 0.1 kW to 10 kW across the initial plasma to increase the ion density of the initial plasma and to sustain the initial plasma proximate to the inner cathode section 702a. The time period between time $t_0$ and time $t_1$ is in the range of about 0.1 msec to 1 sec and depends on several parameters including the dimensions of the inner cathode section 702a, for example.

At time $t_2$, a sufficient volume of the initial plasma is located proximate to the inner cathode section 702a and an additional volume of initial plasma is generated in the region 214. The first power supply 206 then applies a high power pulse 756 across the additional volume of initial plasma in the region 214 to generate a high-density plasma in the region 214. The ion density of the high-density plasma is greater than the ion density of the initial plasma. The high-power pulse 756 has a power level that is in the range of about 10 kW to 1,000 kW. The time period between time $t_1$ and time $t_2$ is in the range of about 0.1 msec to 1 sec.

The high-density plasma that is generated in the region 214 diffuses toward the inner cathode section 702a due to the pressure differential. At time $t_3$, the second power supply 222 applies a high-power pulse 758 to the high-density plasma in order to super-ionize the high-density plasma to further increase the plasma density. The time period between time $t_2$ and time $t_3$ is in the range of about 0.001 msec to 1 msec. The time period of the high-power pulse 758 between time $t_3$ and time $t_4$ is in the range of about 0.1 msec to 10 sec.

Additionally, between time $t_3$ and time $t_5$, the first power supply 206 continues to apply the high-power pulse 756 in order to sustain the high-density plasma. At time $t_5$, the high-power pulse 756 terminates. The second power supply 222 continues to apply a background power 760 after the high-power pulse 758 terminates at time $t_4$. The background power 760 continues to sustain the high-density plasma. The time period between time $t_4$ and time $t_5$ is in the range of about 0.001 msec to 1 msec.

At time $t_5$, the high power pulse 756 generated by the first power supply 206 terminates. At time $t_6$, the first power supply 206 applies another high-power pulse 762 across a new volume of high-density plasma in the region 214. The high-power pulse 762 increases the current density in the new volume of high-density plasma. The new volume of high-density plasma diffuses towards the inner cathode section 702a. At time $t_7$, the second power supply 222 applies another high-power pulse 764 to the new volume of high-density plasma that is located proximate to the inner cathode section 702a. At time $t_8$, the high-power pulse 764 terminates. At time $t_9$, the high power pulse 762 from the first power supply 206 terminates.

The power from the third power supply 704 is continuously applied for a time that is in the range of about one microsecond to one hundred seconds in order to allow the initial plasma to form and to be maintained at a sufficient plasma density. The power from the second power supply 222 can be continuously applied after the initial plasma is ignited in order to maintain the initial plasma. The second power supply 222 can be designed so as to output a continuous nominal power in order to generate and sustain the initial plasma until a high-power pulse is delivered by the second power supply 222. The high-power pulse has a leading edge having a rise time that is in the range of about 0.1 microseconds to ten seconds.

The high-power pulse 756 has a power and a pulse width that is sufficient to transform the initial plasma to a strongly-ionized high-density plasma. The high-power pulse 756 is applied for a time that is in the range of about ten microseconds to ten seconds. The repetition rate of the high-power pulses 756, 762 is in the range of about 0.1 Hz to 1 kHz.

The particular size, shape, width, and frequency of the high-power pulses 756, 762 depend on various factors including process parameters, the design of the first power supply 206, the design of the plasma generating apparatus 700, the volume of the plasma, and the pressure in the chamber. The shape and duration of the leading edge and the trailing edge of the high-power pulse 756 is chosen to sustain the initial plasma while controlling the rate of ionization of the high-density plasma.

FIG. 14 illustrates a graphical representation 770 of power generated as a function of time for each of a first 206, a second 222, and a third power supply 704 for one mode of operating the plasma generating system 700 of FIG. 9. The plasma generating apparatus 700 has many operating modes. For example, in this mode, the first power supply 206 is operated in voltage mode, while the second power supply can be operated in power mode.

In this mode, the plasma generating apparatus 700 can operate as follows. At time $t_0$, the third power supply 704 applies a constant power 772 in the range of about 0.1 kW to 10 kW across the feed gas 234 to generate an initial plasma. In one embodiment, the power from the third power supply 704 is continuously applied for a time that is in the range of about one microsecond to one hundred seconds in order to allow the initial plasma to form and to be maintained at a sufficient plasma density.

The initial plasma diffuses towards the inner cathode section 702a. At time $t_1$, the second power supply 222 applies a constant power 774 in the range of about 0.1 kW to 10 kW across the initial plasma to increase the ion density of the initial plasma and to maintain/sustain the initial plasma proximate to the inner cathode section 702a.

A pressure differential forces the initial plasma from the region 214 towards the inner cathode region 702a. At time $t_2$ the first power supply 206 applies a ramping power pulse 776 across the initial plasma in the region 214 in order to generate a high-density plasma in the region 214. The ramping power pulse 776 has a power and a rise time that is sufficient to transform the initial plasma to a strongly-ionized high-density plasma.

The ramping power pulse 776 has a power that is in the range of about 10 kW to 1,000 kW and the ramping power pulse 776 is applied for a time that is in the range of between about ten microseconds to ten seconds. The repetition rate between the ramping power pulses 776 is between about 0.1 Hz and 1 kHz. The shape and duration of the leading edge and the trailing edge of the ramping power pulse 776 is chosen to sustain the initial plasma while controlling the rate of ionization of the high-density plasma. The high-density plasma diffuses toward the inner cathode section 702a.

At time $t_3$, the second power supply 222 applies a high-power pulse 778 to the high-density plasma to generate a higher-density plasma. At time $t_4$, the high-power pulse and the ramping power pulse 776 terminate. The second power supply 222 continues to apply a background power 780 to sustain the plasma after the high-power pulse 778 terminates. The second power supply 222 can be designed so as to generate a continuous nominal power that generates and sustains the initial plasma until a high-power pulse is delivered by the second power supply 222. In one embodiment, the high-power pulse has a leading edge with a rise time that is in the range of about 0.1 microseconds to ten seconds.

At time $t_5$, the first power supply 206 applies another ramping power pulse 782 across an additional volume of initial plasma in the region 214. The ramping power pulse 782 increases the current density in the additional volume of initial plasma to generate a high-density plasma. At time $t_6$, the second power supply 222 applies another high-power pulse 784 to the high-density plasma that is located proximate to the inner cathode section 702a. The high-power pulse generates a higher density plasma proximate to the inner cathode section 702a. At time $t_7$, the high-power pulse 784 and the ramping power pulse 782 terminate. In one embodiment, the repetition rate between the ramping power pulses 776, 782 is between about 0.1 Hz and 1 kHz.

FIG. 15 illustrates a graphical representation 790 of power as a function of time for each of a first 206, a second 222, and a third power supply 704 for one mode of operating the plasma generating system 700 of FIG. 9. In this mode, the second power supply 222 is a RF power supply. A RF power supply can be used in plasma sputtering systems for sputtering magnetic materials or dielectric materials, for example. In this mode of operation, the first power supply 206 is operated in a constant power mode. Due to the nature of a RF power supply, the second power supply 222 is operated in a substantially constant power mode.

In this mode, the plasma generating apparatus 700 can operate as follows. At time $t_0$, the third power supply 704 applies a constant power 752 in the range of about 0.1 kW to 10 kW across the feed gas 234 to generate an initial plasma. The power level required to generate the initial plasma depends on several factors including the dimensions of the region 214, for example. The constant power 752 is applied between the ionizing electrode 708 and the outer cathode section 702b. The initial plasma diffuses towards the inner cathode section 702a due to a pressure differential as described herein. The pressure differential forces the initial plasma from the region 214 towards the inner cathode section 702a.

At time $t_1$, the second power supply 222 applies an RF driving voltage corresponding to a power 792 in the range of about 0.1 kW to 10 kW across the initial plasma to sustain the initial plasma proximate to the inner cathode section 702a. The RF power supply generates a series of very short sinusoidal voltage pulses having a time period between time $t_0$ and time $t_1$ that is in the range of about 0.1 msec to 1 sec and that depends on several parameters, such as the dimensions of the inner cathode section 702a.

At time $t_2$, a sufficient volume of the initial plasma is located proximate to the inner cathode section 702a and an additional volume of initial plasma is generated in the region 214. The first power supply 206 then applies a high-power pulse 756 across the additional volume of initial plasma in the region 214 to generate a high-density plasma in the region 214. The ion density of the high-density plasma is greater than the ion density of the initial plasma. The high-power pulse 756 has a power level that is in the range of about 10 kW to 1,000 kW. In one embodiment, the time period between time $t_1$ and time $t_2$ is in the range of about 0.1 msec to 1 sec.

The high-density plasma that is generated in the region 214 diffuses toward the inner cathode section 702a due to the pressure differential. At time $t_3$, the second power supply 222 applies a high-power RF pulse 794 to the high-density plasma. The high-power RF pulse super-ionizes the high-density plasma, thereby generating a higher-density plasma. In one embodiment, the frequency of the high-power pulse 794 is 13.56 MHz. In other embodiments, the frequency of the high power RF pulse 794 is in the range of about 40 kHz to 100 MHz.

In one embodiment, the time period between time $t_2$ and time $t_3$ is in the range of about 0.001 msec to 1 msec. The total time period of the high-power pulse 794 between time $t_3$ and time $t_4$ is in the range of about 0.01 microsec to 10 sec.

Additionally, between time $t_3$ and time $t_5$, the first power supply 206 continues to apply the high-power pulse 756 in order to maintain the high-density plasma. At time $t_5$, the high-power pulse 756 terminates. In one embodiment, the second power supply 222 continues to apply a background RF driving voltage corresponding to a power 796 after the high-power pulse 794 terminates at time $t_4$. The background RF power 796 continues to maintain the high-density plasma. The time period between time $t_4$ and time $t_5$ is in the range of about 0.001 msec to 1 msec.

At time $t_6$, the first power supply 206 applies another high-power pulse 762 across a new volume of initial plasma in the region 214. The high-power pulse 762 generates a new volume of high-density plasma. The new volume of high-density plasma diffuses towards the inner cathode section 702a. At time $t_7$, the second power supply 222 applies RF driving voltage corresponding to another high-power pulse 798 to the new volume of high-density plasma that is located proximate to the inner cathode section 702a. At time $t_8$, the high-power pulse 798 terminates. At time $t_9$, the high power pulse 762 from the first power supply 206 terminates.

The power 752 from the third power supply 704 is continuously applied for a time that is in the range of about one microsecond to one hundred seconds in order to allow the initial plasma to form and to be maintained at a sufficient plasma density. In one embodiment, the RF power from the second power supply 222 is continuously applied after the initial plasma is ignited in order to maintain the initial plasma.

The high-power pulse 756 has a power and a pulse width that is sufficient to transform the initial plasma to a strongly-ionized high-density plasma. The high-power pulse 756 is applied for a time that is in the range of about ten microseconds to ten seconds. The repetition rate of the high-power pulses 756, 762 is in the range of about 0.1 Hz to 1 kHz.

The particular size, shape, width, and frequency of the high-power pulses 756, 762 depend on various factors including process parameters, the design of the first power supply 206, the design of the plasma generating apparatus 700, the volume of the plasma, and the pressure in the chamber, for example. The shape and duration of the leading edge and the trailing edge of the high-power pulse 756 is chosen to sustain the initial plasma while controlling the rate of ionization of the high-density plasma.

Figure 16A:
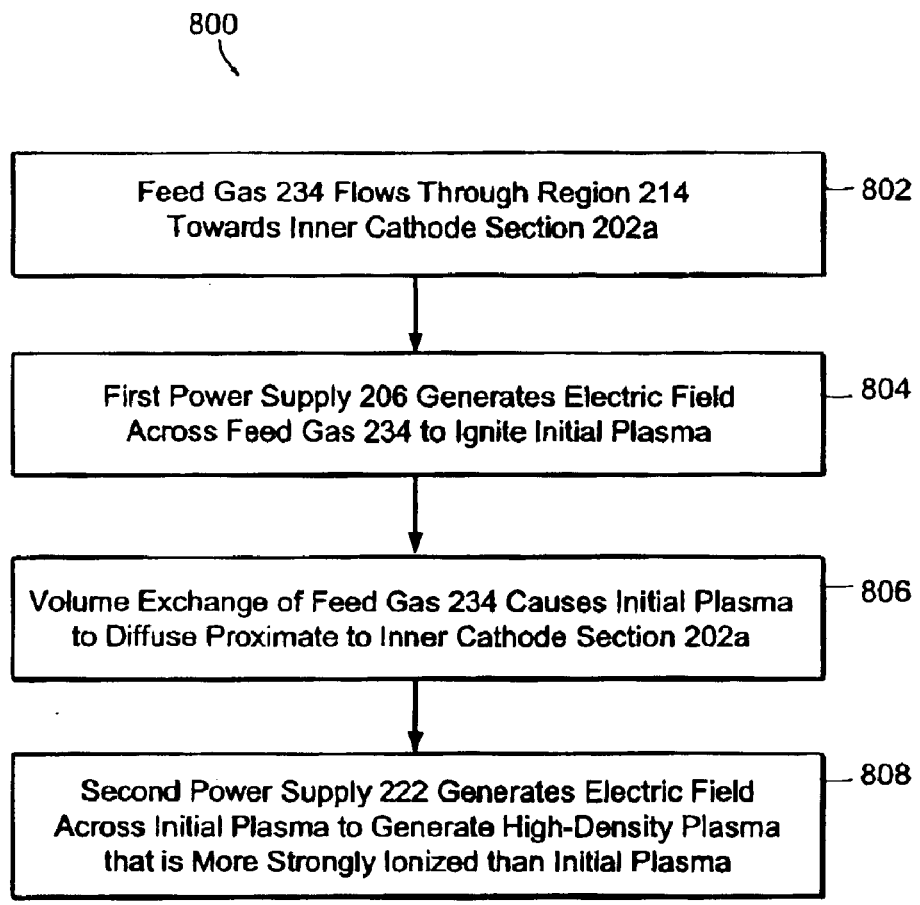
FIG. 16A through FIG. 16C are flowcharts of illustrative processes of generating high-density plasmas according to the present invention.
Figure 16B:
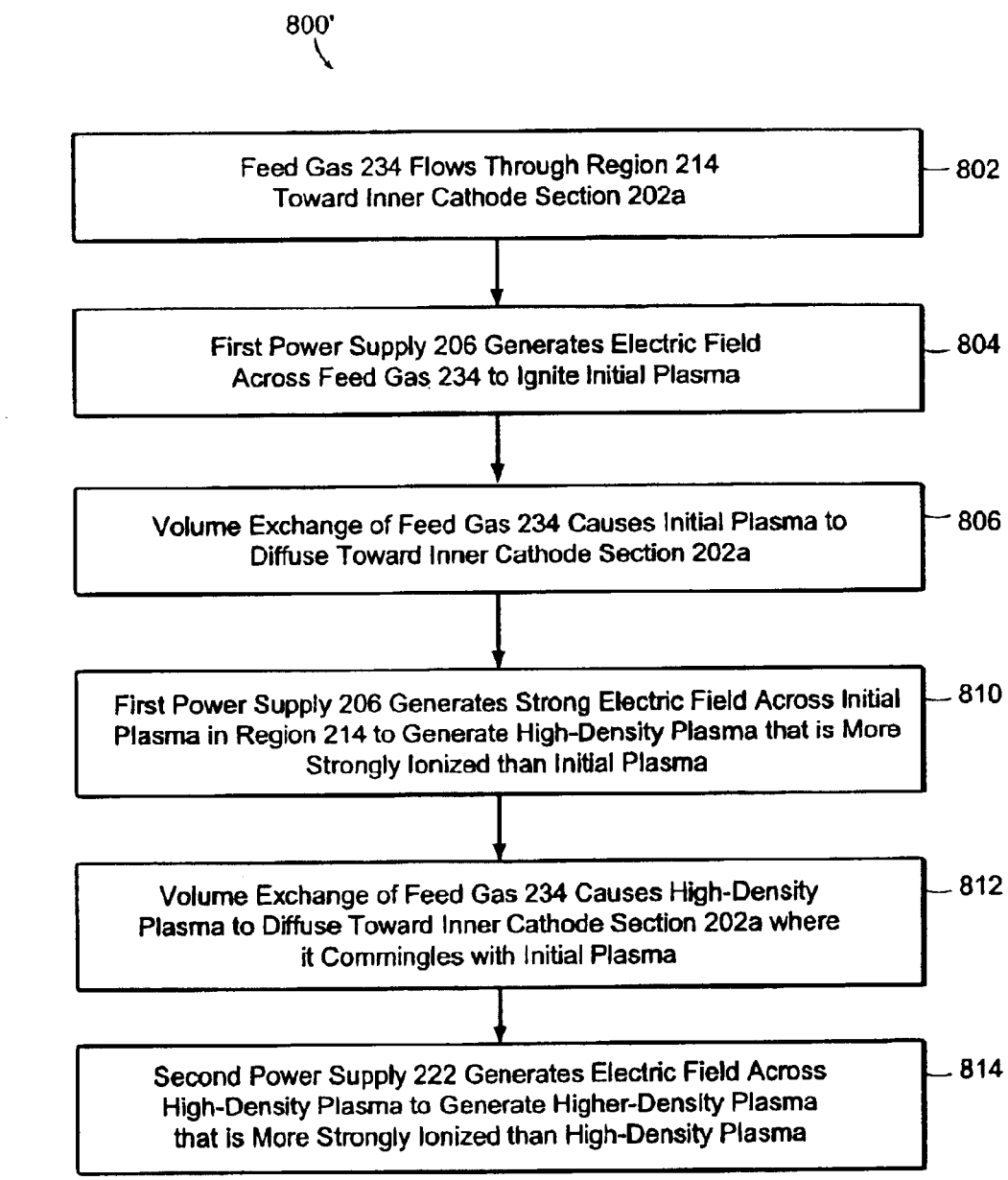
Figure 16C:
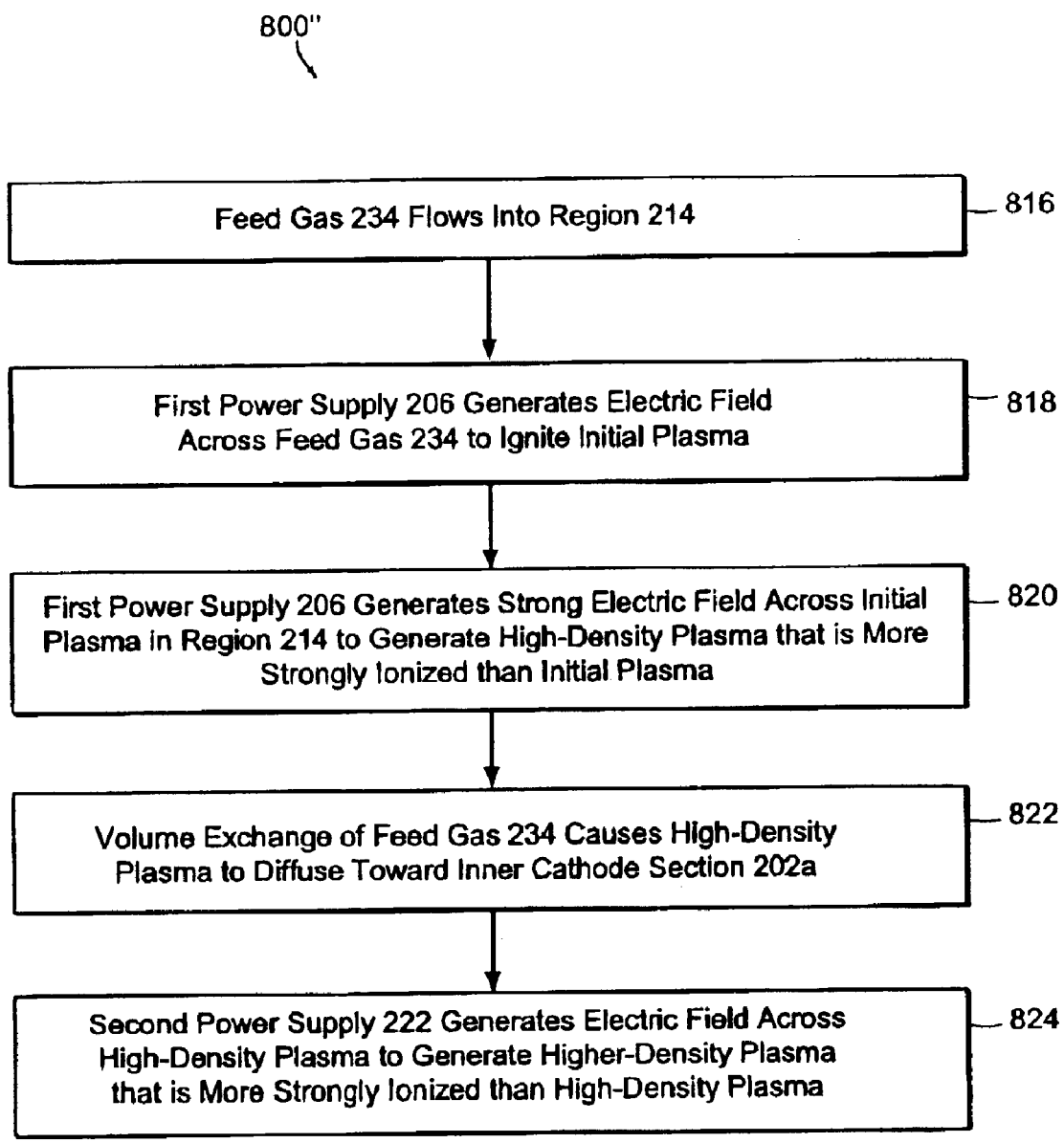

FIG. 16A through FIG. 16C are flowcharts 800, 800', and 800'' of illustrative processes of generating high-density plasmas according to the present invention. Referring to FIG. 16A, the feed gas 234 (FIG. 2) flows into the region 214 (step 802). The feed gas 234 flows through the region 214 towards the inner cathode section 202a. Next, the first power supply 206 generates a voltage across the feed gas 234 in the region 214 (step 804). The voltage generates an electric field that is large enough to ignite the feed gas 234 and generate the initial plasma. While the initial plasma is being generated, additional feed gas flows into the region 214 forcing the initial plasma to diffuse proximate to the inner cathode section 202a (step 806).

After a suitable volume of the initial plasma is present in the region 252, the second power supply 222 generates a large electric field across the initial plasma that super-ionizes the initial plasma, thereby generating a high-density plasma in the region 252 (step 808). The high-density plasma is typically more strongly ionized than the initial plasma.

In the process illustrated in FIG. 16B, the feed gas 234 flows into the region 214 (step 802). In one embodiment, the feed gas 234 flows through the region 214 towards the inner cathode section 202a. Next, the first power supply 206 generates a voltage across the feed gas 234 in the region 214 (step 804). The voltage is large enough to ignite the feed gas 234 and to generate the initial plasma. While the initial plasma is being generated, additional feed gas 234 flows into the region 214 forcing the initial plasma to diffuse proximate to the inner cathode section 202a (step 806).

Once the initial plasma is generated in the region 214, the first power supply 206 generates a strong electric field across the initial plasma, thereby super-ionizing the initial plasma and creating a high-density plasma in the region 214 (step 810). In one embodiment, an additional power supply (not shown) generates the strong electric field instead of the first power supply 206.

The high-density plasma diffuses towards the inner cathode section 202a where it commingles with the initial plasma in the region 252 (step 812). When a suitable volume of the combined plasma is present in the region 252, the second power supply 222 generates a strong electric field across the plasma in the region 252 that generates a high-density plasma (step 814). The high-density plasma will typically be more strongly-ionized than the plasma formed from the combination of the initial plasma and the high-density plasma from the region 214.

In the embodiment illustrated in FIG. 16C, the feed gas 234 flows into the region 214 (step 816). In one embodiment, the feed gas 234 flows through the region 214 towards the inner cathode section 202a. Next, the first power supply 206 generates a voltage across the feed gas 234 in the region 214 (step 818). The voltage generates an electric field that is large enough to ignite the feed gas 234 and generate the initial plasma. In this embodiment, additional feed gas 234 is not supplied to the region 214 and therefore, the initial plasma remains in the region 214.

Once the initial plasma is generated in the region 214, the first power supply 206 generates a strong electric field across the initial plasma, thereby super-ionizing the initial plasma and creating a high-density plasma in the region 214 (step 820). In one embodiment, an additional power supply (not shown) generates the strong electric field instead of the first power supply 206. Once the high-density plasma is present in the region 214, additional feed gas 234 is supplied to the region 214, displacing the high-density plasma towards the inner cathode section 202a (step 822).

When a suitable volume of high-density plasma is present in the region 252, the second power supply 222 generates a strong electric field across the high-density plasma in the region 252 to generate a higher-density plasma (step 824). The higher-density plasma will typically be more strongly-ionized than the high-density plasma from the region 214.

While the invention has been particularly shown and described with reference to specific preferred embodiments, it should be understood by those skilled in the art that various changes in form and detail may be made therein without departing from the spirit and scope of the invention as defined herein.

What is claimed is:

1. A plasma source comprising:
   a cathode assembly comprising an inner cathode section and an outer cathode section;
   an anode that is positioned adjacent to the outer cathode section and forming a gap there between;
   a first power supply that generates a first electric field across the gap, the first electric field ionizing a volume of feed gas that is located in the gap, thereby generating an initial plasma; and
   a second power supply that generates a second electric field proximate to the inner cathode section, the second electric field super-ionizing the initial plasma to generate a plasma comprising a higher density of ions than the initial plasma.

2. The plasma source of claim 1 further comprising a second anode that is positioned adjacent to the inner cathode section, the second power supply generating the second electric field between the inner cathode section and the second anode.

3. The plasma source of claim 1 wherein the first and the second power supplies are chosen from the group comprising a pulsed DC power supply, an AC power supply, a DC power supply, and a RF power supply.

4. The plasma source of claim 1 wherein the first power supply further generates a third electric field across the gap, the third electric field super-ionizing the initial plasma that is located in the gap.

5. The plasma source of claim 1 further comprising a third power supply that generates a third electric field across the gap, the third electric field super-ionizing the initial plasma that is located in the gap.

6. The plasma source of claim 1 wherein the first and the second power supplies comprise a single power supply that generates the first and the second electric fields.

7. The plasma source of claim 1 wherein the first and the second electric fields are chosen from the group comprising a static electric field, a pulsed electric field, a quasi-static electric field, and an alternating electric field.

8. The plasma source of claim 1 wherein the initial plasma comprises a weakly-ionized plasma.

9. The plasma source of claim 1 wherein the plasma comprising the higher density of ions comprises a strongly-ionized plasma.

10. The plasma source of claim 1 wherein the super-ionizing the initial plasma comprises converting at least seventy-five percent of neutral atoms in the initial plasma to ions.

11. The plasma source of claim 1 wherein the first electric field generates excited atoms in the initial plasma and generates secondary electrons from the outer cathode section, the secondary electrons ionizing the excited atoms, thereby creating a plasma comprising a higher density of ions than the initial plasma.

12. The plasma source of claim 1 further comprising a gas valve that controls the flow of feed gas so as to exchange the initial plasma with a second volume of feed gas as the first power supply generates the first electric field across the second volume of feed gas, thereby increasing an ion density of the plasma.

13. The plasma source of claim 1 further comprising a gas valve that injects feed gas between the outer cathode section and the anode at a predetermined time.

14. The plasma source of claim 1 wherein at least one of the first and the second power supplies generates the first and the second electric fields, respectively, with a constant power.

15. The plasma source of claim 1 wherein at least one of the first and the second power supplies generates the first and the second electric fields, respectively, with a constant voltage.

16. The plasma source of claim 1 wherein at least one of the first and the second power supplies generates the first and the second electric fields, respectively, with a constant current.

17. The plasma source of claim 1 further comprising a magnet assembly that is positioned to generate a magnetic field proximate to at least one of the inner and the outer cathode sections, the magnetic field trapping electrons in at least one of the initial plasma and the plasma comprising the higher density of ions.

18. The plasma source of claim 17 wherein the magnet assembly comprises a plurality of magnets that generate magnetic field lines that are substantially parallel to at least one of the inner and the outer cathode sections.

19. The plasma source of claim 1 wherein at least one of the inner and the outer cathode sections comprises a target material that is used for sputtering.

20. A method of generating a high-density plasma, the method comprising:
    generating a first electric field across a gap between an anode and an outer cathode section, the first electric field ionizing a volume of feed gas that is located in the gap, thereby generating an initial plasma in the gap;
    exchanging the initial plasma with a second volume of feed gas while applying the first electric field across the gap, thereby generating an additional plasma in the gap; and
    generating a second electric field proximate to the inner cathode section, the second electric field super-ionizing the initial plasma, thereby generating a plasma comprising a higher density of ions than the initial plasma.

21. The method of claim 20 wherein the generating the first electric field across the gap comprises generating excited atoms in the initial plasma and generating secondary electrons from the outer cathode section, the secondary electrons ionizing the excited atoms, thereby creating a plasma comprising a higher density of ions than the initial plasma.

22. The method of claim 20 wherein the first and the second electric fields are chosen from the group comprising a static electric field, a quasi-static electric field, a pulsed electric field, and an alternating electric field.

23. The method of claim 20 wherein the peak ion density of the initial plasma is between about $10^7$ cm$^{-3}$ and $10^{12}$ cm$^{-3}$.

24. The method of claim 20 wherein the peak ion density of the plasma comprising the higher density of ions is greater than about $10^{12}$ cm$^{-3}$.

25. The method of claim 20 wherein the super-ionizing the initial plasma comprises converting at least seventy-five percent of neutral atoms in the initial plasma to ions.

26. The method of claim 20 further comprising generating a magnetic field proximate to at least one of the inner and outer cathode sections, the magnetic field trapping electrons in at least one of the initial plasma and the plasma comprising the higher density of ions.

27. The method of claim 26 wherein the magnetic field comprises magnetic field lines that are substantially parallel to at least one of the inner and the outer cathode sections.

28. The method of claim 20 wherein the presence of the initial plasma reduces a probability of developing an electrical breakdown condition proximate to the inner cathode section as the second electric field is generated.

29. The method of claim 20 further comprising exposing a substrate to the plasma comprising the higher density of ions, thereby etching a surface of the substrate.

30. A segmented cathode assembly for generating a high-density plasma, the segmented cathode assembly comprising:
   an inner cathode section;
   an outer cathode section that surrounds the inner cathode section; and
   a first anode that is positioned adjacent to the outer cathode section and forming a gap there between.

31. The segmented cathode assembly of claim 30 further comprising a second anode that surrounds the inner cathode section.

32. The segmented cathode assembly of claim 30 further comprising a magnet assembly that is positioned to generate a magnetic field proximate to at least one of the inner and the outer cathode sections.

33. The segmented cathode assembly of claim 32 wherein the magnet assembly is rotatable.

34. The segmented cathode assembly of claim 32 wherein the magnet assembly comprises a plurality of magnets that generate magnetic field lines that are substantially parallel to at least one of the inner and the outer cathode sections.

35. The segmented cathode assembly of claim 30 wherein at least one of the inner and the outer cathode sections comprises a target material that is used for sputtering.

36. The segmented cathode assembly of claim 30 further comprising at least one gas valve that injects feed gas into the gap at a predetermined time.

37. The segmented cathode assembly of claim 31 further comprising at least one gas valve that injects feed gas between the inner cathode section and the second anode at a predetermined time.

38. A method of generating a high-density plasma, the method comprising:
   ionizing a volume of feed gas that is located in a gap between an anode and an outer cathode section to generate an initial plasma;
   transporting the initial plasma proximate to an inner cathode section; and
   super-ionizing the initial plasma that is located proximate to the inner cathode section, thereby generating a plasma comprising a higher density of ions than the initial plasma.

39. The method of claim 38 wherein the ionizing a volume of feed gas comprises applying an electric field across the volume of feed gas.

40. The method of claim 38 wherein the super-ionizing the initial plasma comprises applying an electric field across the initial plasma.

41. The method of claim 38 wherein the peak ion density of the initial plasma is between about $10^7$ cm$^{-3}$ and $10^{12}$ cm$^{-3}$.

42. The method of claim 38 wherein the peak ion density of the plasma comprising the higher density of ions is greater than about $10^{12}$ cm$^{-3}$.

43. The method of claim 38 wherein the super-ionizing the initial plasma comprises converting at least seventy-five percent of neutral atoms in the initial plasma to ions.

44. The method of claim 38 wherein the transporting the initial plasma proximate to the inner cathode section comprises exchanging the initial plasma with a second volume of feed gas.

45. A plasma source comprising:
   means for generating a first electric field across a gap between an anode and an outer cathode section, the first electric field ionizing a volume of feed gas that is located in the gap, thereby generating an initial plasma in the gap;
   means for exchanging the initial plasma with a second volume of feed gas while applying the first electric field across the gap, thereby generating an additional plasma in the gap; and
   means for generating a second electric field proximate to an inner cathode section, the second electric field super-ionizing the initial plasma, thereby generating a plasma comprising a higher density of ions than the initial plasma.

46. A plasma source comprising:
   means for ionizing a volume of feed gas that is located in a gap between an anode and an outer cathode section to generate an initial plasma;
   means for transporting the initial plasma proximate to an inner cathode section; and
   means for super-ionizing the initial plasma that is located proximate to the inner cathode section, thereby generating a plasma comprising a higher density of ions than the initial plasma.

* * * * *